US012677531B2

(12) United States Patent
Chen et al.

(10) Patent No.: US 12,677,531 B2
(45) Date of Patent: Jul. 7, 2026

(54) ARRAY SUBSTRATE, DISPLAY APPARATUS, AND METHOD OF FABRICATING ARRAY SUBSTRATE

(71) Applicants: Mianyang BOE Optoelectronics Technology Co., Ltd., Mianyang (CN); BOE Technology Group Co., Ltd., Beijing (CN)

(72) Inventors: Chienyu Chen, Beijing (CN); Yaohong Tan, Beijing (CN); Mingche Hsieh, Beijing (CN); Yinglong Huang, Beijing (CN); Wen Sun, Beijing (CN); Jenyu Lee, Beijing (CN); Guoren Hu, Beijing (CN)

(73) Assignees: Mianyang BOE Optoelectronics Technology Co., Ltd., Mianyang (CN); BOE Technology Group Co., Ltd., Beijing (CN)

( * ) Notice: Subject to any disclaimer, the term of this patent is extended or adjusted under 35 U.S.C. 154(b) by 1155 days.

(21) Appl. No.: 17/641,874

(22) PCT Filed: Jul. 28, 2021

(86) PCT No.: PCT/CN2021/108954
§ 371 (c)(1),
(2) Date: Feb. 2, 2023

(87) PCT Pub. No.: WO2023/004631
PCT Pub. Date: Feb. 2, 2023

(65) Prior Publication Data
US 2024/0049497 A1 Feb. 8, 2024

(51) Int. Cl.
*H10K 50/18* (2023.01)
*H10K 59/12* (2023.01)
(Continued)

(52) U.S. Cl.
CPC ......... *H10K 50/18* (2023.02); *H10K 59/1201* (2023.02); *H10K 59/122* (2023.02); *H10K 59/173* (2023.02)

(58) Field of Classification Search
CPC ............. H10K 50/18; H10K 50/00–88; H10K 59/1201; H10K 59/122; H10K 59/173;
(Continued)

(56) References Cited

U.S. PATENT DOCUMENTS

2010/0194269 A1 8/2010 Sonoda et al.
2014/0103368 A1 4/2014 Hatano et al.
(Continued)

FOREIGN PATENT DOCUMENTS

CN 101682956 A 3/2010
CN 103781215 A 5/2014
(Continued)

OTHER PUBLICATIONS

International Search Report & Written Opinion mailed Feb. 24, 2022, regarding PCT/CN2021/108954.

*Primary Examiner* — Steven B Gauthier
*Assistant Examiner* — Rhys Poniente Sheker
(74) *Attorney, Agent, or Firm* — Intellectual Valley, P.C.

(57) ABSTRACT
An array substrate is provided. The array substrate includes an anode layer including a plurality of anodes on the base substrate, a respective anode being at least partially in a respective subpixel region; a carrier transport blocking layer on a side of the anode layer away from the base substrate, the carrier transport blocking layer at least partially blocking carrier transport; a pixel definition layer on a side of the carrier transport blocking layer away from the base substrate, the pixel definition layer defining subpixel apertures, a respective subpixel aperture exposing at least a portion of the respective anode; and an organic layer including at least
(Continued)

a first portion in the respective subpixel region and on a side
of the anode layer away from the base substrate.

20 Claims, 23 Drawing Sheets

(51) Int. Cl.
  *H10K 59/122*       (2023.01)
  *H10K 59/173*       (2023.01)
(58) Field of Classification Search
  CPC .. H10K 59/873; H10K 59/352; H10K 59/353;
                               H10L 59/00–95
  See application file for complete search history.

(56)                  References Cited

U.S. PATENT DOCUMENTS

| | | |
|---|---|---|
| 2017/0025489 A1 | 1/2017 | Choi et al. |
| 2017/0373124 A1* | 12/2017 | Yang .................... H10K 59/879 |
| 2019/0280063 A1* | 9/2019 | Lee ....................... H10K 59/122 |
| 2020/0235172 A1* | 7/2020 | Lee ........................ H10K 50/17 |
| 2020/0251541 A1 | 8/2020 | Kim et al. |
| 2021/0351250 A1* | 11/2021 | Guo .................... H10K 59/121 |

FOREIGN PATENT DOCUMENTS

| | | |
|---|---|---|
| CN | 107134532 A | 9/2017 |
| CN | 110299389 A | 10/2019 |
| CN | 111524933 A | 8/2020 |

* cited by examiner

ARRAY SUBSTRATE, DISPLAY APPARATUS, AND METHOD OF FABRICATING ARRAY SUBSTRATE

CROSS-REFERENCE TO RELATED APPLICATION

This application is a national stage application under 35 U.S.C. § 371 of International Application No. PCT/CN2021/108954, filed Jul. 28, 2021, the contents of which are incorporated by reference in the entirety.

TECHNICAL FIELD

The present invention relates to display technology, more particularly, to an array substrate, a display apparatus, and a method of fabricating an array substrate.

BACKGROUND

An organic light emitting diode display apparatus typically includes an anode, an organic layer including at least a light emitting layer, and a cathode. OLEDs can either be a bottom-emission type OLED or a top-emission type OLED. In bottom-emission type OLEDs, the light is extracted from an anode side. In bottom-emission type OLEDs, the anode is generally transparent, while a cathode is generally reflective. In a top-emission type OLED, light is extracted from a cathode side. The cathode is optically transparent, while the anode is reflective.

SUMMARY

In one aspect, the present disclosure provides an array substrate comprising a plurality of subpixels, a respective subpixel comprising a respective light emitting diode; the array substrate comprises a base substrate: an anode layer comprising a plurality of anodes on the base substrate, a respective anode being at least partially in a respective subpixel region; a carrier transport blocking layer on a side of the anode layer away from the base substrate, the carrier transport blocking layer at least partially blocking carrier transport; a pixel definition layer on a side of the carrier transport blocking layer away from the base substrate, the pixel definition layer defining subpixel apertures, a respective subpixel aperture exposing at least a portion of the respective anode: and an organic layer comprising at least a first portion in the respective subpixel region and on a side of the anode layer away from the base substrate; wherein an orthographic projection of the pixel definition layer on the base substrate at least partially overlaps with an orthographic projection of the carrier transport blocking layer on the base substrate; the orthographic projection of the carrier transport blocking layer on the base substrate at least partially overlaps with an orthographic projection of the anode layer on the base substrate: and an area where the orthographic projection of the carrier transport blocking layer on the base substrate overlaps with the orthographic projection of the anode layer on the base substrate is greater than an area where the orthographic projection of the pixel definition layer on the base substrate overlaps with the orthographic projection of the anode layer on the base substrate.

Optionally, the inter-subpixel region comprises a plurality of edge sub-regions, a respective edge sub-region surrounding the respective subpixel region; and in the respective edge sub-region, an orthographic projection of the respective anode on the base substrate partially overlaps with an orthographic projection of the carrier transport blocking layer on the base substrate, and partially overlaps with an orthographic projection of the pixel definition layer on the base substrate.

Optionally, the respective edge sub-region comprises an inner sub-region surrounding the respective subpixel region, and an outer sub-region surrounding the inner sub-region; and the pixel definition layer is present in the outer sub-region and absent in the inner sub-region.

Optionally, the organic layer further comprises a second portion at least partially in a respective edge sub-region surrounding the respective subpixel region, the second portion at least partially surrounding the first portion; and in the respective edge sub-region, the carrier transport blocking layer is stacked on the respective anode, the second portion is stacked on the carrier transport blocking layer, the carrier transport blocking layer electrically insulating the second portion from the respective anode, thereby at least partially blocking carrier transport in the second portion.

Optionally, an orthographic projection of the carrier transport blocking layer on the base substrate covers an orthographic projection of the second portion on the base substrate; and an orthographic projection of the respective anode on the base substrate partially overlaps with the orthographic projection of the second portion on the base substrate.

Optionally, the organic layer comprises at least an organic material sub-layer, a first sub-portion of the organic material sub-layer in the first portion, a second sub-portion of the organic material sub-layer in the second portion; the first sub-portion and the second sub-portion are at least partially discontinuous sub-portions at least partially segregated due to presence of the carrier transport blocking layer; and the second portion surrounds the first portion.

Optionally, the pixel definition layer comprises a tapered portion at least partially in a respective edge sub-region surrounding the respective subpixel region; the tapered portion has a first surface in contact with the carrier transport blocking layer and a second surface connected to the first surface, the second surface in contact with a second portion of the organic layer; and the second surface has an average slope angle with respect to the first surface of less than 60 degrees and greater than 1 degrees.

Optionally, the organic layer further comprises a second portion at least partially in a respective edge sub-region surrounding the respective subpixel region; and the second portion is at least partially stacked on the tapered portion in an outer sub-region of the respective edge sub-region, and at least partially stacked on the carrier transport blocking layer in an inner sub-region of the respective edge sub-region.

Optionally, the organic layer comprises at least one of an organic light emitting sub-layer; a hole transport sub-layer: a hole injection sub-layer: an electron transport sub-layer; an electron injection sub-layer; a hole barrier layer: or an electron barrier layer.

Optionally, the carrier transport blocking layer comprises an inorganic insulating material; the pixel definition layer comprises an organic photoresist polymer material; the carrier transport blocking layer has a thickness in a range of 0.8 μm to 1.4 μm; and the pixel definition layer has a thickness in a range of 1.0 pin to 1.8 μm.

Optionally, the orthographic projection of the anode layer on the base substrate is non-overlapping with the orthographic projection of the pixel definition layer on the base substrate.

Optionally, the organic layer further comprises a second portion on a side of the carrier transport blocking layer away from the base substrate; the pixel definition layer has a first surface in contact with the carrier transport blocking layer and a second surface connected to the first surface, the second surface being in contact with the second portion; and the second surface has an average slope angle with respect to the first surface of greater 30 degrees and less than 150 degrees.

Optionally, the organic layer further comprises a third portion on a side of the pixel definition layer away from the base substrate; the organic layer comprises at least an organic material sub-layer, a first sub-portion of the organic material sub-layer in the first portion, a second sub-portion of the organic material sub-layer in the second portion, and a third sub-portion of the organic material sub-layer in the third portion; the first sub-portion and the second sub-portion are at least partially discontinuous sub-portions at least partially segregated due to presence of the carrier transport blocking layer; and the second sub-portion and the third sub-portion are at least partially discontinuous sub-portions at least partially segregated due to presence of the pixel definition layer.

Optionally, an orthographic projection of a surface of the pixel definition layer on a side away from the base substrate on the base substrate covers an orthographic projection of a surface of the pixel definition layer on a side closer to the base substrate on the base substrate; and in a cross-section along a plane intersecting two adjacent subpixel regions and perpendicular to the base substrate, at least a portion of the pixel definition layer has an inverse trapezoidal shape.

Optionally, the array substrate comprises a recess recessing into at least a portion of the pixel definition layer; the organic layer further comprises second portion at least partially in the recess and a third portion on top of the pixel definition layer; the organic layer comprises at least an organic material sub-layer, a first sub-portion of the organic material sub-layer in the first portion, a second sub-portion of the organic material sub-layer in the second portion, and a third sub-portion of the organic material sub-layer in the third portion; the first sub-portion and the second sub-portion are at least partially discontinuous sub-portions at least partially segregated due to presence of the carrier transport blocking layer; and the second sub-portion and the third sub-portion are at least partially discontinuous sub-portions at least partially segregated due to presence of the recess.

Optionally, an orthographic projection of the anode layer on the base substrate covers an orthographic projection of the carrier transport blocking layer on the base substrate; and an orthographic projection of at least a portion of the pixel definition layer on the base substrate is non-overlapping with the orthographic projection of the carrier transport blocking layer on the base substrate.

Optionally, the inter-subpixel region comprises a plurality of edge sub-regions, a respective edge sub-region surrounding the respective subpixel region; and the carrier transport block-mg layer is limited in the plurality of edge sub-regions.

Optionally, the carrier transport blocking layer includes a plurality of ring structures spaced apart from each other by the pixel definition layer.

Optionally, the array substrate further comprises a cathode layer on a side of the organic layer away from the base substrate; the cathode layer has a protrusion, an orthographic projection of the protrusion on the base substrate at least partially overlaps with an orthographic projection of an edge of the carrier transport blocking layer on the base substrate;

and the edge is an edge of the carrier transport blocking layer surrounding the respective subpixel region.

Optionally, the array substrate further comprises an encapsulating layer on a side of the cathode layer away from the base substrate; the encapsulating layer has a protrusion, an orthographic projection of the protrusion on the base substrate at least partially overlaps with an orthographic projection of an edge of the carrier transport blocking layer on the base substrate; and the edge is an edge of the carrier transport blocking layer surrounding the respective subpixel region.

Optionally, the organic layer further comprises a second portion at least partially in a respective edge sub-region surrounding the respective subpixel region, the second portion at least partially surrounding the first portion; a respective sub-layer in the first portion and a respective sub-layer in the second portion have a substantially the same thickness along a direction perpendicular to the base substrate; and the first portion and the second portion have a same number of sub-layers and a same stacking sequence of sub-layers.

Optionally, an edge of the carrier transport blocking layer surrounding the respective subpixel region has a third surface in contact with the respective anode and a fourth surface connected to the third surface, the fourth surface in contact with the organic layer; the fourth surface has a second average slope angle with respect to the third surface in a range of 70 degrees to 160 degrees; and the second average slope angle is greater than the average slope angle.

In another aspect, the present disclosure provides a display apparatus, comprising the array substrate described herein or fabricated by a method described herein, and one or more integrated circuits connected to the array substrate.

In another aspect, the present disclosure provides a method of fabricating an array substrate comprising a plurality of subpixels, a respective subpixel comprising a respective light emitting diode, comprising forming an anode layer comprising a plurality of anodes on a base substrate, a respective anode being at least partially in a respective subpixel region; forming a carrier transport blocking layer on a side of the anode layer away from the base substrate, the carrier transport blocking layer at least partially blocking carrier transport; forming a pixel definition layer on a side of the carrier transport blocking layer away from the base substrate, the pixel definition layer defining subpixel apertures, a respective subpixel aperture exposing at least a portion of the respective anode; and forming an organic layer comprising at least a first portion in the respective subpixel region and on a side of the anode layer away from the base substrate: wherein an orthographic projection of the pixel definition layer on the base substrate at least partially overlaps with an orthographic projection of the carrier transport blocking layer on the base substrate; the orthographic projection of the carrier transport blocking layer on the base substrate at least partially overlaps with an orthographic projection of the anode layer on the base substrate: and an area where the orthographic projection of the carrier transport blocking layer on the base substrate overlaps with the orthographic projection of the anode layer on the base substrate is greater than an area where the orthographic projection of the pixel definition layer on the base substrate overlaps with the orthographic projection of the anode layer on the base substrate

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, an array substrate, a display apparatus, and a method of fabricating an array substrate that substantially obviate one or more of the problems due to limitations and disadvantages of the related art. In one aspect, the present disclosure provides an array substrate. In some embodiments, the array substrate includes a plurality of subpixels, a respective subpixel comprising a respective light emitting diode. In some embodiments, the array substrate includes a base substrate: an anode layer comprising a plurality of anodes on the base substrate, a respective anode being at least partially in a respective subpixel region; a carrier transport blocking layer on a side of the anode layer away from the base substrate, the carrier transport blocking layer being in an inter-subpixel region; a pixel definition layer on a side of the carrier transport blocking layer away from the base substrate, the pixel definition layer being in the inter-subpixel region; and an organic layer comprising at least a first portion in the respective subpixel region and on a side of the anode layer away from the base substrate.

Figure 1:
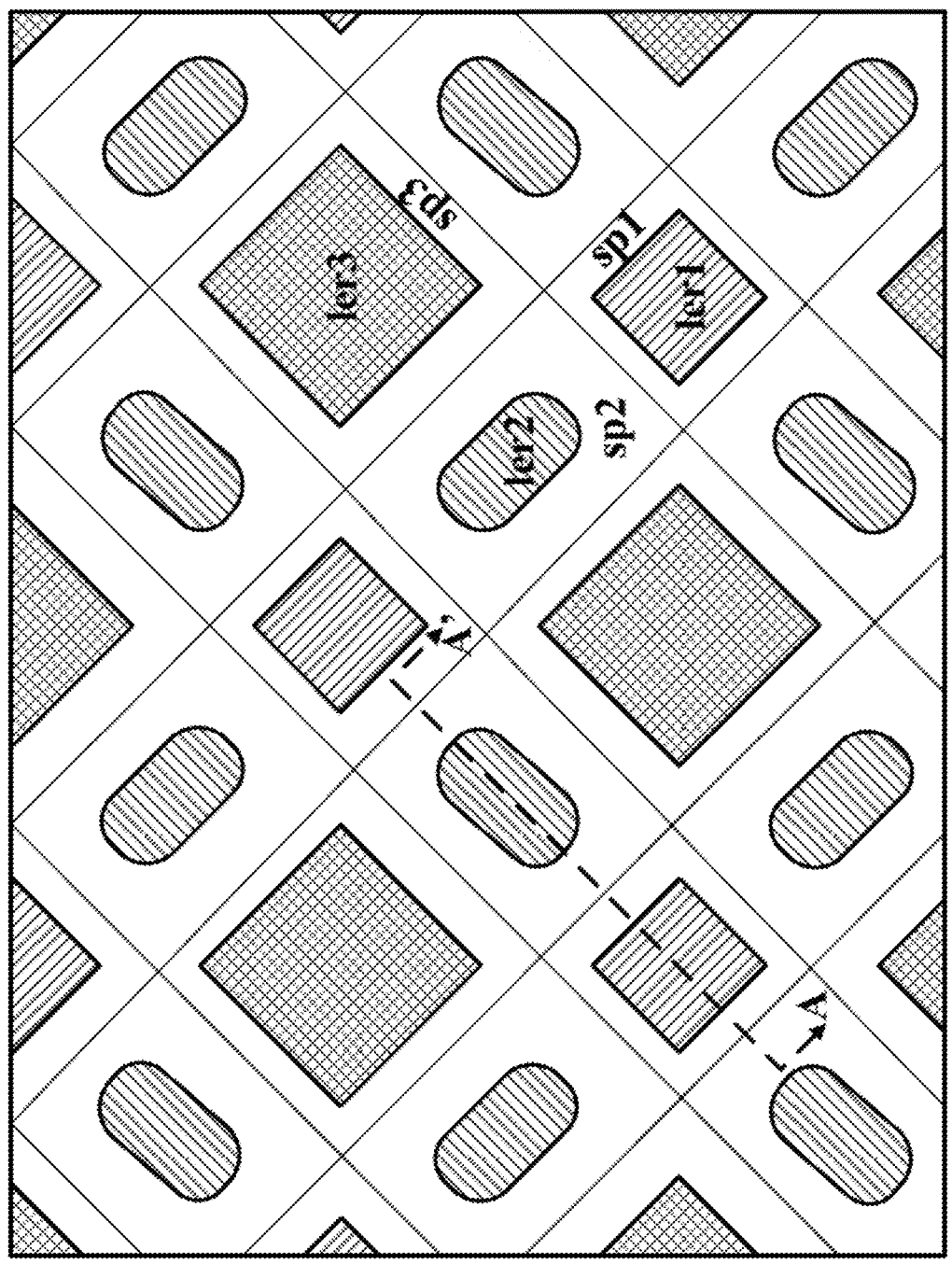
FIG. 1 is a schematic diagram illustrating an array substrate in some embodiments according to the present disclosure.

FIG. 1 is a schematic diagram illustrating an array substrate in some embodiments according to the present disclosure. Referring to FIG. 1, the array substrate in some embodiments includes a plurality of subpixels, for example, a respective first subpixel of a first color sp1, a respective second subpixel of a second color sp2, and a respective third subpixel of a third color sp3. In one example, the first color is a red color, the second color is a green color, and the third color is a blue color, A respective subpixel includes a respective light emitting diode. In another example, the respective first subpixel of the first color sp1 includes a first light emitting diode of the first color, the respective second subpixel of the second color sp2 includes a second light emitting diode of the second color, and the respective third subpixel of the third color sp3 includes a third light emitting diode of the first color. Light emitting regions respectively of the plurality of subpixels are denoted in FIG. 1. For example, the respective first subpixel of the first color sp1 has a respective first light emitting region ler1, the respective second subpixel of the second color sp2 has a respective second light emitting region ler2, and the respective third subpixel of the third color sp3 has a respective third light emitting region ler3.

Various appropriate light emitting elements may be used in the present array substrate. Examples of appropriate light emitting elements include organic light emitting diodes, quantum dots light emitting diodes, and micro light emitting diodes. Optionally, the light emitting element is an organic light emitting diode including an organic light emitting layer.

An organic light emitting diode includes an anode, an organic layer including at least a light emitting layer, and a cathode. In some embodiments, the organic layer includes a plurality of sub-layers. In some embodiments, the organic layer includes one or more of a hole transport sub-layer, a hole injection sub-layer, a light emitting sub-layer (e.g., a red light emitting sub-layer, a light emitting prime sub-layer, and a light emitting prime sub-layer), an electron transport sub-layer, an electron injection sub-layer, a charge generation sub-layer, an electron blocking sub-layer, a hole blocking sub-layer, a prime sub-layer (e.g., a red prime sub-layer, a green prime sub-layer, and a blue prime sub-layer), and a capping sub-layer.

In some embodiments, one or more sub-layers of the organic layer are fabricated using a mask plate specific for a subpixel of a specific color. For example, a red light emitting sub-layer is fabricated using a mask plate specific for red subpixels, a green light emitting sub-layer is fabricated using a mask plate specific for green subpixels, and a blue light emitting sub-layer is fabricated using a mask plate specific for blue subpixels. Similarly, a prime sub-layer is also fabricated using a mask plate specific for a subpixel of a specific color.

In some embodiments, one or more sub-layers of the organic layer are fabricated using an open mask, in which an organic material is deposited throughout a plurality of subpixels, over both a subpixel region and an inter-subpixel region of the array substrate. Examples of sub-layers that may be fabricated using an open mask include the hole transport sub-layer, the hole injection sub-layer, electron transport sub-layer, the electron injection sub-layer, the electron blocking sub-layer, the hole blocking sub-layer, and the capping sub-layer. At least one of these sub-layers includes a material having relatively good carrier transport property. Carriers are prone to move in a lateral direction, resulting in leaking current in the lateral direction. When a light emitting diode is configured to emit light, adjacent light emitting diodes are affected by the leaking current, resulting in crosstalk.

Typically, subpixel apertures are defined by a pixel definition layer. An anode layer is formed on a base substrate (e.g., a second planarization layer), the anode layer is formed to include a plurality of anodes. A photoresist layer is formed on the anode layer, and is exposed and developed to remove portions of the photoresist layer, respectively corresponding to a plurality of subpixel apertures, thereby forming the pixel definition layer. Light emitting layers of different colors are then deposited respectively onto subpixel apertures of different colors, thereby forming light emitting microcavities.

Because the pixel definition layer is fabricated using a photoresist material, it is difficult to make side walls of the subpixel apertures steep. During the exposure process of the photoresist layer, light intensity of the exposure light is not uniform in all positions of the exposure. At a position of the photoresist layer corresponding to a center of the subpixel aperture, light intensity is relatively higher, whereas at a position of the photoresist layer corresponding to a periphery of the subpixel aperture, light intensity is relatively lower. Due to non-uniformity of light intensity during exposure, the side walls of the pixel definition layer unavoidably is formed to have a slope of a relatively small slope angle. Moreover, the flow of the photoresist material after the exposure process, toward the direction of greater freedom of volume, further contributes to formation of a slope of a small slope angle.

Figure 2:
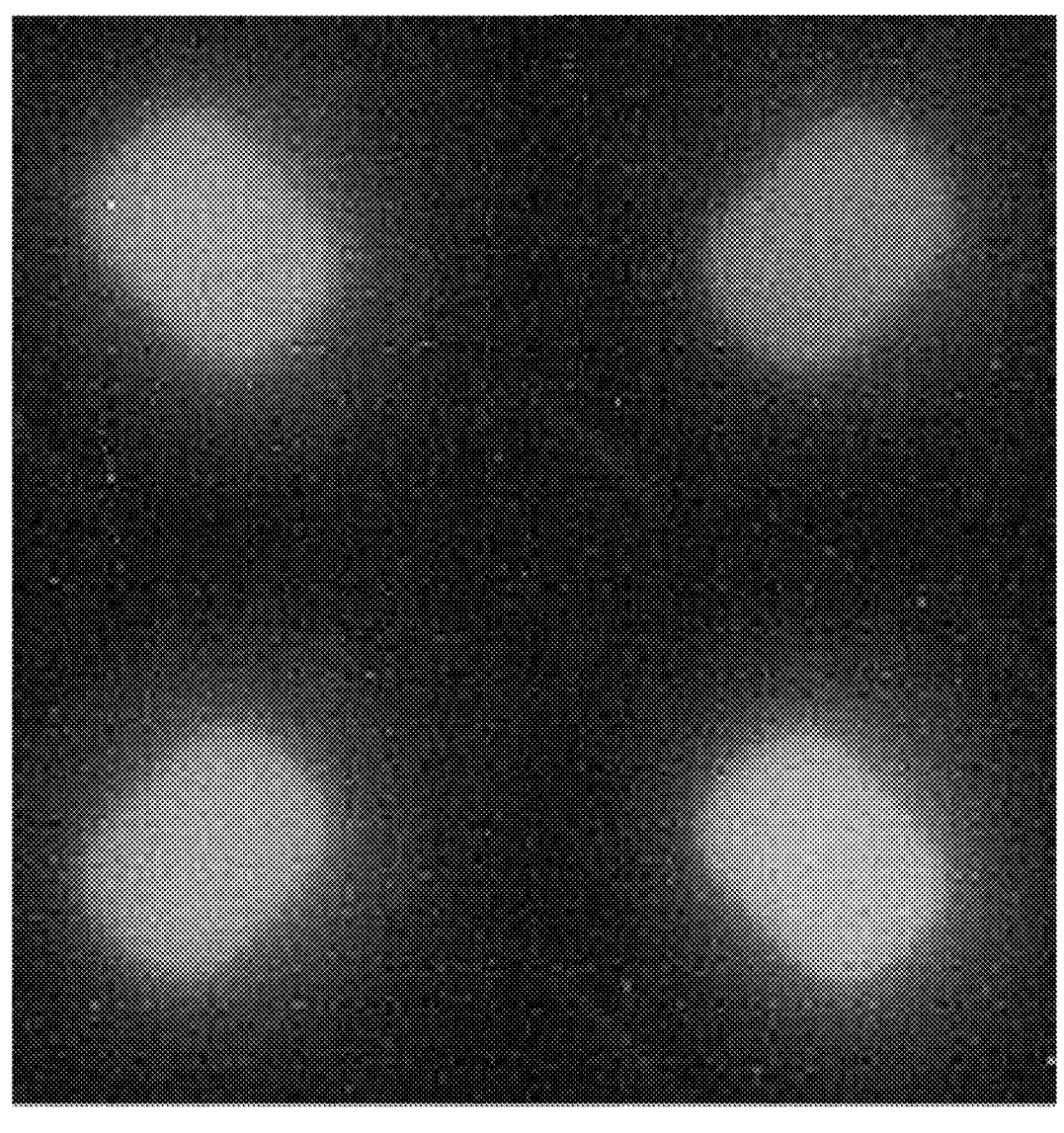
FIG. 2 shows a coffee ring in an array substrate when subpixels are lit.

In the deposition process of a light emitting organic material, typically the mask plate has an opening larger than the subpixel aperture. At least a portion of the light emitting organic material is deposited on the sloped side wall of the pixel definition layer. When a light emitting diode is configured to emit light in the subpixel aperture, the residual light emitting organic material on the sloped side wall of the pixel definition layer also emit light, because carriers (e.g., holes) may enter this portion of light emitting organic material when the energy of the carriers is greater than a carrier injection energy barrier. A halo ring (also referred to as a coffee ring) surrounding the subpixel aperture appears, severely affecting color saturation. FIG. 2 shows a coffee rig ii an array substrate when certain subpixels are lit.

Figure 3:
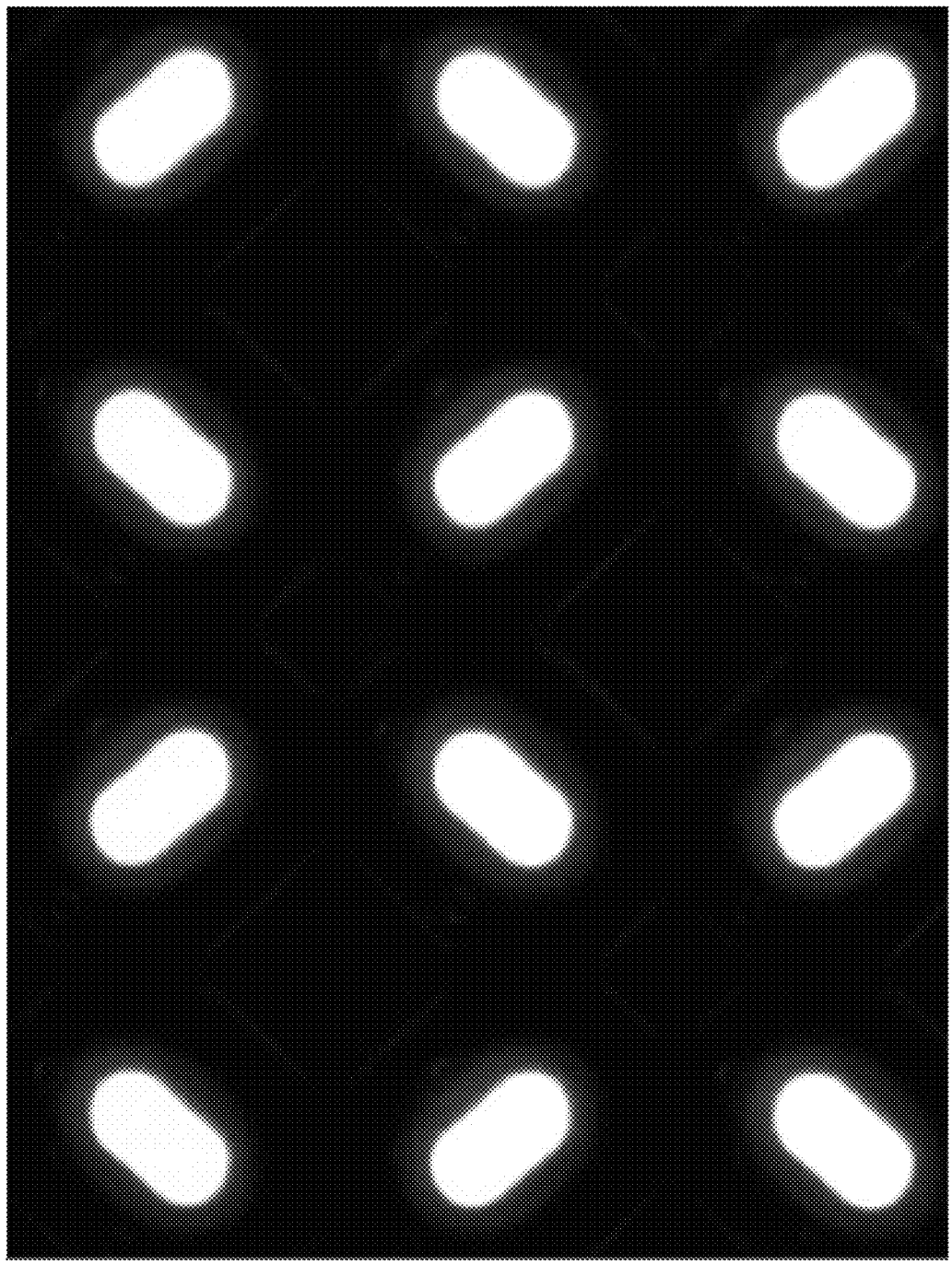
FIG. 3 shows elimination of the coffee ring in an array substrate when certain subpixels are lit in some embodiments according to the present disclosure.

The inventors of the present disclosure discover that, surprisingly and unexpectedly, the coffee ring can be eliminated completely or at least partially by having a carrier transport blocking layer on a side of the anode layer away from the base substrate. FIG. 3 shows elimination of the coffee ring in an array substrate when certain subpixels are lit in some embodiments according to the present disclosure. Comparing FIG. 2 and FIG. 3, the coffee ring in the array substrate according to the present disclosure is substantially eliminated, and color saturation is significantly enhanced.

Figure 4:
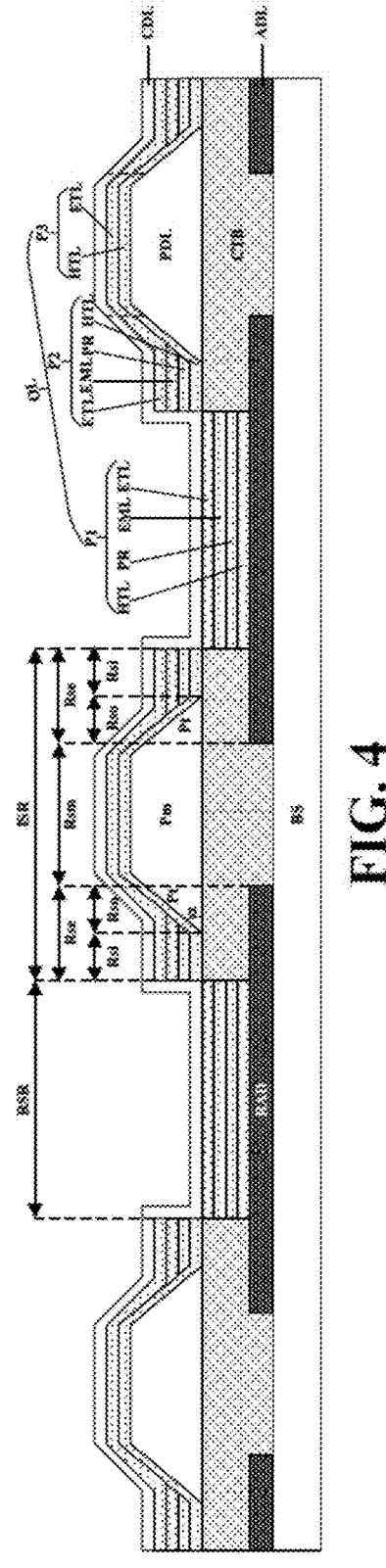
FIG. 4 is a cross-sectional view along an A-A' line in FIG. 1.

FIG. 4 is a cross-sectional view along an A-A' line in FIG. 1. Referring to FIG. 4, the array substrate in some embodiments includes a base substrate BS: an anode layer ADL including a plurality of anodes on the base substrate BS, a respective anode RAD being at least partially in a respective subpixel region RSR; a carrier transport blocking layer CTB on a side of the anode layer ADL away from the base substrate BS, the carrier transport blocking layer CTB being in an inter-subpixel region ISR; a pixel definition layer PDL on a side of the carrier transport blocking layer CTB away from the base substrate BS, the pixel definition layer PDL being in the inter-subpixel region ISR; and an organic layer OL including at least a first portion P1 in the respective subpixel region RSR and on a side of the anode layer ADL away from the base substrate BS.

As used herein, a subpixel region refers to a light emission region of a subpixel, such as a region corresponding to a pixel electrode in a liquid crystal display, a region corresponding to a light emissive layer in an organic light emitting diode display panel, or a region defined by side walls or edges of the carrier transport blocking layer according to the present disclosure. Optionally, a pixel may include a number of separate light emission regions corresponding to a number of subpixels in the pixel. Optionally, the subpixel region is a light emission region of a red color subpixel. Optionally, the subpixel region is a light emission region of a green color subpixel. Optionally, the subpixel region is a light emission region of a blue color subpixel. Optionally, the subpixel region is a light emission region of a white color subpixel.

As used herein, an inter-subpixel region refers to a region between adjacent subpixel regions, such as a region corresponding to a black matrix in a liquid crystal display, a region corresponding a pixel definition layer in an organic light emitting diode display panel, or a region occupied by a combination of the carrier transport blocking layer and the pixel definition layer according to the present disclosure. Optionally, the inter-subpixel region is a region between adjacent subpixel regions in a same pixel. Optionally, the inter-subpixel region is a region between two adjacent subpixel regions from two adjacent pixels. Optionally, the inter-subpixel region is a region between a subpixel region of a red color subpixel and a subpixel region of an adjacent green color subpixel. Optionally, the inter-subpixel region is a region between a subpixel region of a red color subpixel and a subpixel region of an adjacent blue color subpixel. Optionally, the inter-subpixel region is a region between a subpixel region of a green color subpixel and a subpixel region of an adjacent blue color subpixel.

Figure 5:
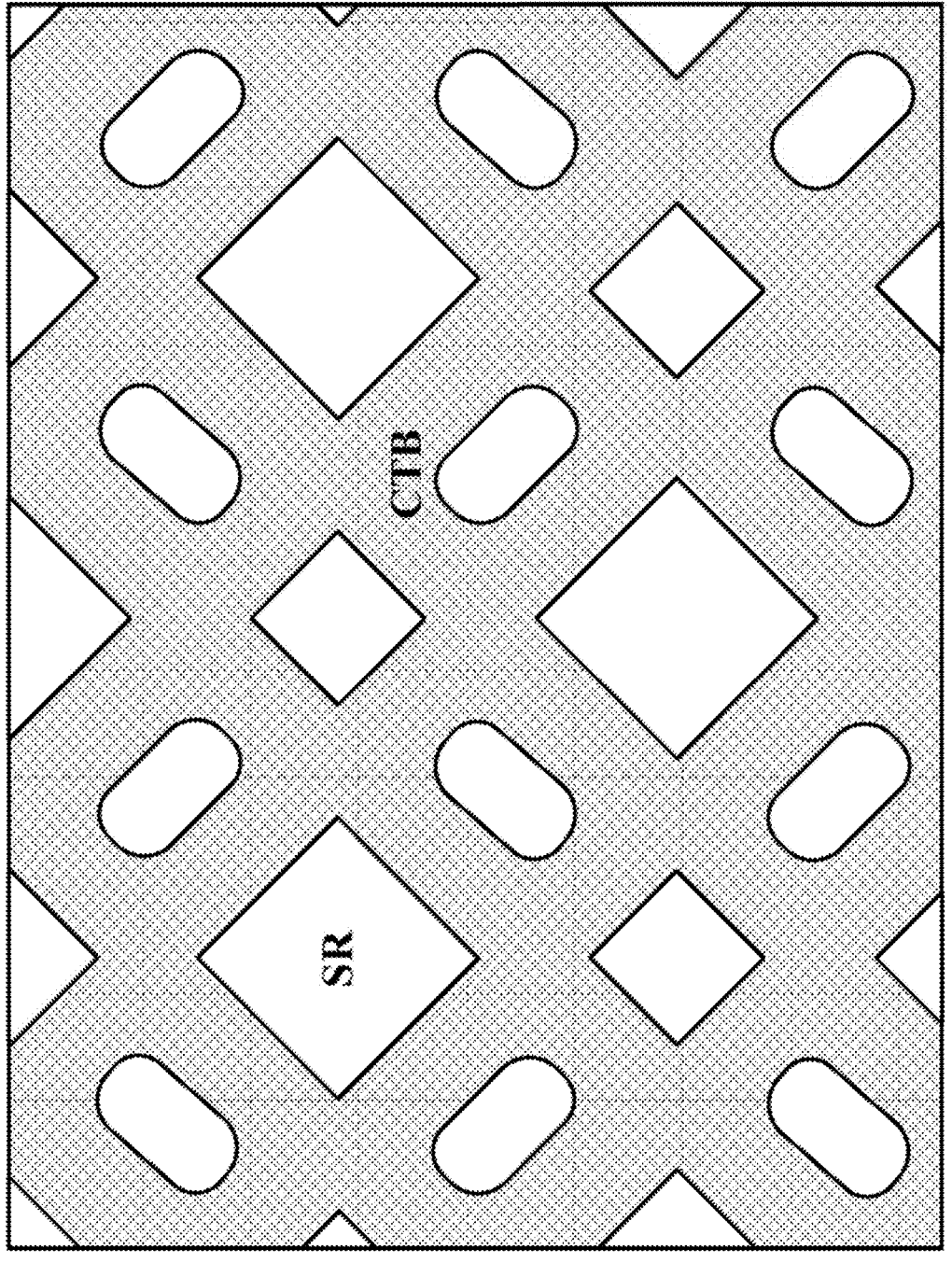
FIG. 5 is a plan view of a carrier transport blocking layer in an array substrate in some embodiments according to the present disclosure.
Figure 6:
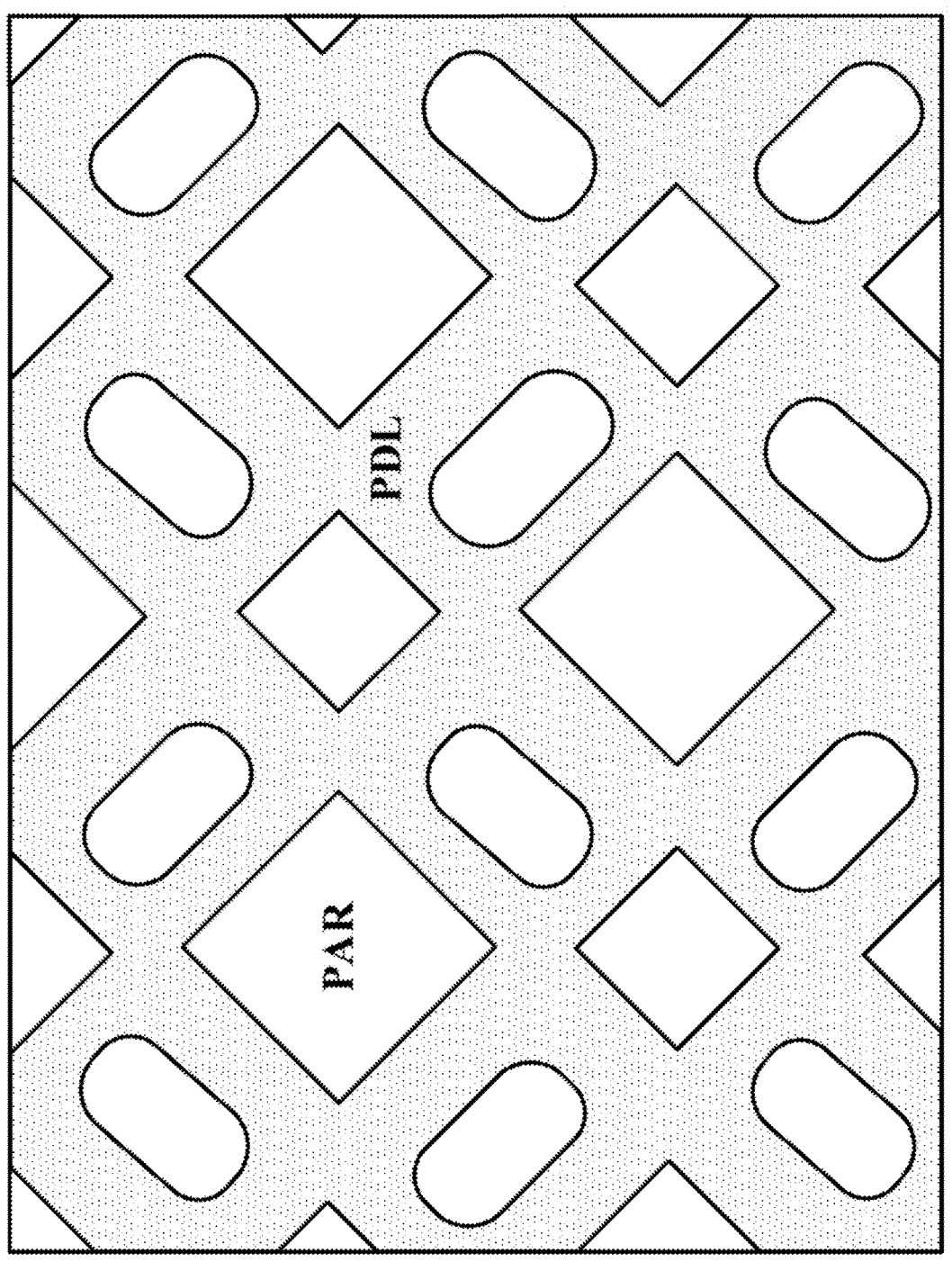
FIG. 6 is a plan view of a pixel definition layer in an array substrate in some embodiments according to the present disclosure.
Figure 7:
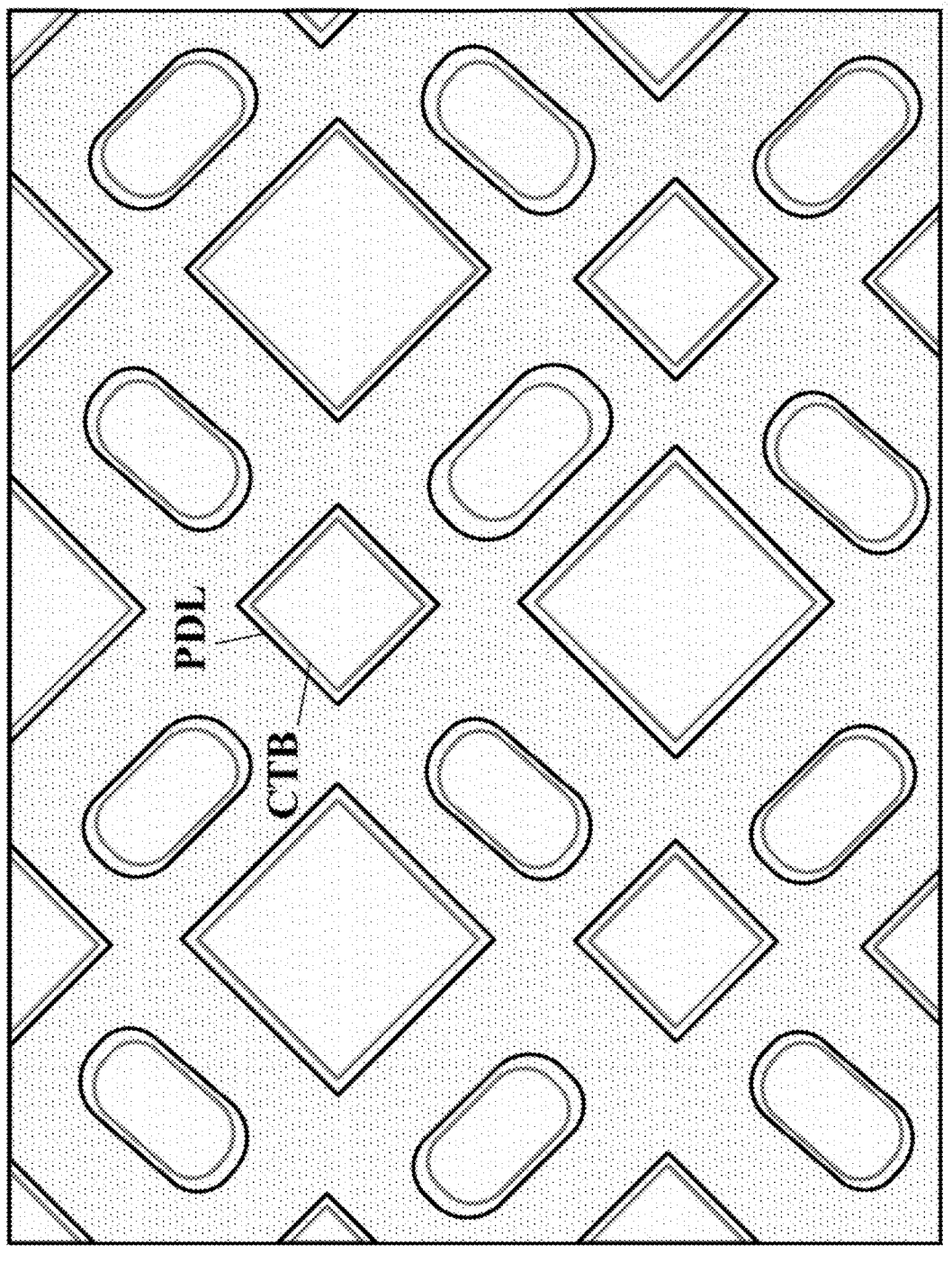
FIG. 7 illustrates a superimposition of a carrier trans-ort blocking layer and a pixel definition layer in an array substrate in some embodiments according to the present disclosure.

FIG. 5 is a plan view of a carrier transport blocking layer hi an array substrate in some embodiments according to the present disclosure. FIG. 5 depicts an overall view of the layout of the carrier transport blocking layer CTB in the array substrate. FIG. 6 is a plan view of a pixel definition layer in an array substrate in some embodiments according to the present disclosure. FIG. 5 depicts an overall view of the layout of the pixel definition layer PDL in the array substrate. FIG. 7 illustrates a superimposition of a carrier transport blocking layer and a pixel definition layer hi an array substrate hi some embodiments according to the present disclosure. As shown in FIG. 4, and FIG. 5 to FIG. 7, in some embodiments, the carrier transport blocking layer CTB defines a plurality of subpixel apertures SR; and the pixel definition layer PDL defines a plurality of PDL apertures PAR. A respective PDL aperture is larger than a respective subpixel aperture SR. An orthographic projection of the respective PDL aperture on the base substrate BS covers an orthographic projection of the respective subpixel aperture SR.

In some embodiments, an orthographic projection of the carrier transport blocking layer CTB on the base substrate BS covers an orthographic projection of the pixel definition layer PDL on the base substrate BS. Optionally, the orthographic projection of the carrier transport blocking layer CTB on the base substrate BS partially overlaps with an orthographic projection of the respective anode PAD on the base substrate BS. Optionally, the orthographic projection of the pixel definition layer PDL, on the base substrate BS partially overlaps with an orthographic projection of the respective anode RAD on the base substrate BS.

Figure 8:
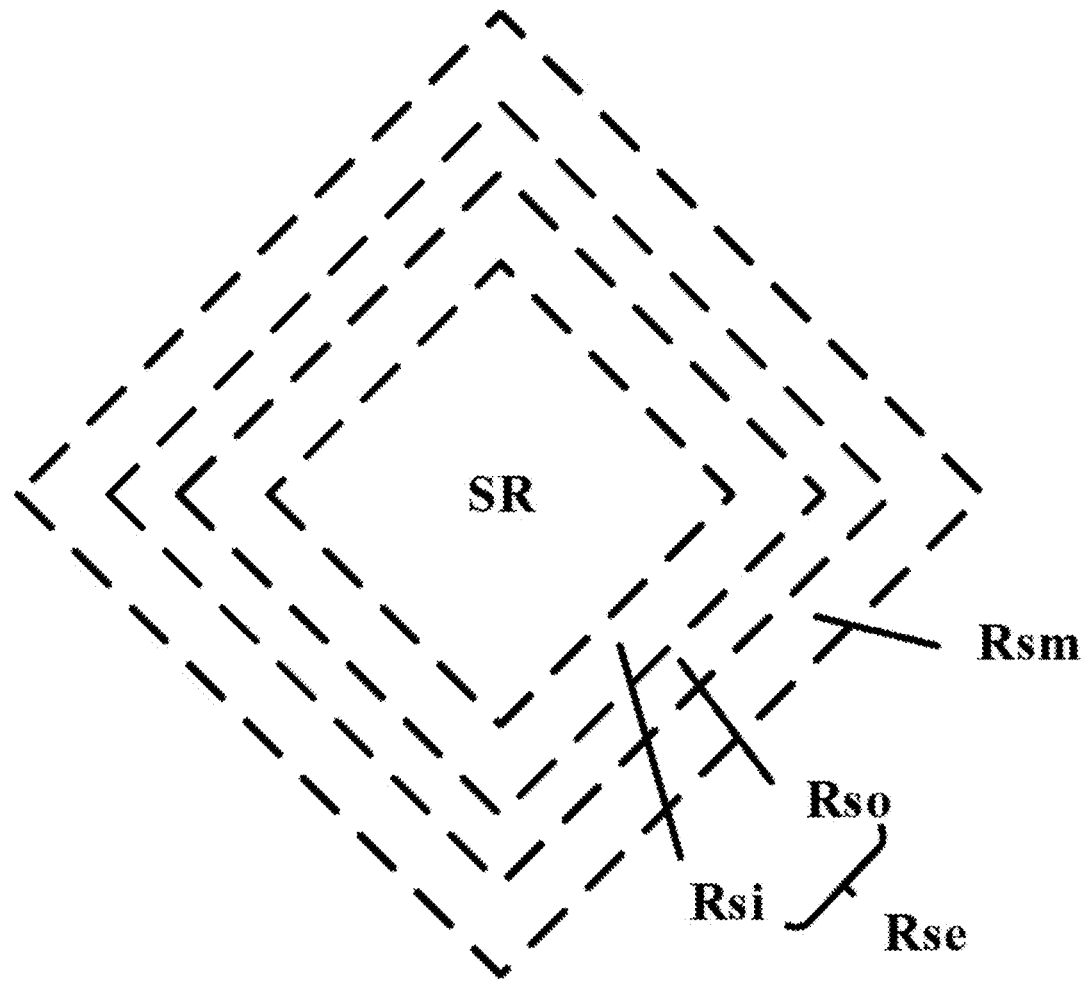
FIG. 8 is a plan view of a respective edge sub-region surrounding a respective subpixel region in some embodiments according to the present disclosure.

In some embodiments, the inter-subpixel region ISR comprises a plurality of edge sub-regions, a respective edge sub-region surrounding the respective subpixel region. FIG. 8 is a plan view of a respective edge sub-region surrounding a respective subpixel region in some embodiments according to the present disclosure. Referring to FIG. 4 and FIG. 8, in some embodiments, a respective edge sub-region Rse surrounds the respective subpixel region RSR. Optionally, the plurality of edge sub-regions respectively surround the plurality of subpixel regions corresponding to the plurality of subpixels.

In some embodiments, the respective edge sub-region Rse has a ring shape. As used herein, the term "ring" or "ring structure" refers to a structure or portion of a structure having a hole there through, including but not limited to a ring or doughnut shape. A ring structure or a ring shape may be essentially round like a doughnut, or may be formed of a square, triangle or another shape with a hole there through. As used herein, a ring structure or a ring shape does not require that the ring shape be unbroken, and the term is intended to encompass structures that are substantially closed, but that comprise a break or a gap in the ring shape. Optionally, a ring structure or a ring shape is unbroken. A ring structure or a ring shape may be formed of a square, rectangle, triangle or another shape with a hole there through, or may be essentially round like a doughnut. In some embodiments, the ring structure is formed of a square or rectangle shape with a hole there through. Optionally, the ring is a square ring. Optionally, the ring is a rectangle ring.

Referring to FIG. 4, in some embodiments, in the respective edge sub-region Rse, an orthographic projection of the respective anode RAD on the base substrate BS partially overlaps with an orthographic projection of the carrier transport blocking layer CTB on the base substrate BS, and partially overlaps with an orthographic projection of the pixel definition layer PDL on the base substrate BS.

Figure 9:
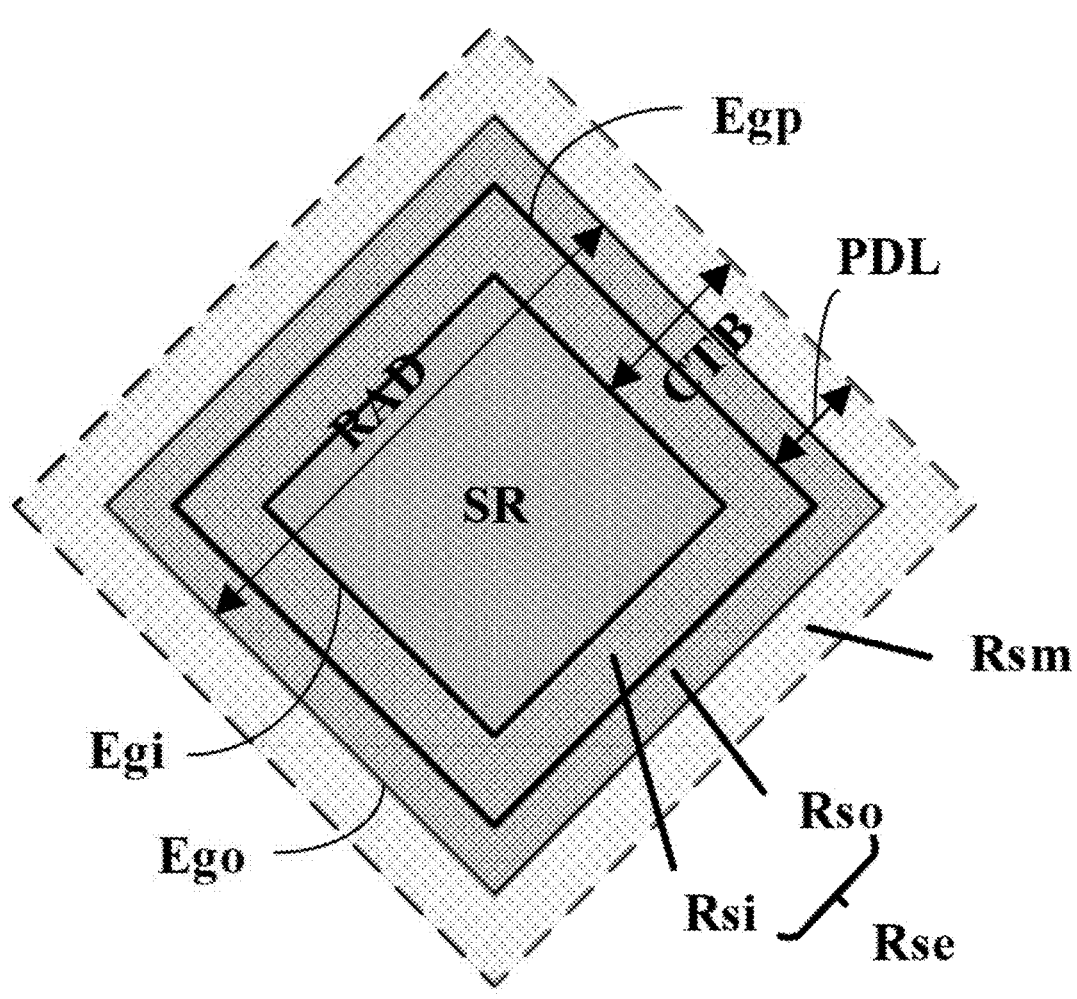
FIG. 9 is a plan view of a respective anode and a carrier transport blocking layer in a respective edge sub-region in some embodiments according to the present disclosure.

FIG. 9 is a plan view of a respective anode and a carrier transport blocking layer in a respective edge sub-region in some embodiments according to the present disclosure. Referring to FIG. 4. FIG. 8, and FIG. 9, in some embodiments, the respective edge sub-region Rse is a region where the orthographic projection of the respective anode PAD overlaps with the orthographic projection of the carrier transport blocking layer CTB. In one example, the respective edge sub-region Rse is defined by an outer edge Ego of the respective anode RAD and an inner edge Egi of the carrier transport blocking layer CTB. Optionally, the inner edge Egi of the carrier transport blocking layer CTB also defines the respective subpixel region RSR.

Referring to FIG. 4, FIG. 8, and FIG. 9, in some embodiments, the respective edge sub-region Rse includes an inner sub-region Rsi surrounding the respective subpixel region RSR, and an outer sub-region Rso surrounding the inner sub-region Rsi. As shown in FIG. 8 and FIG. 9, in some embodiments, the inner sub-region Rsi has a ring shape, and the outer sub-region Rso has a ring shape.

Referring to FIG. 4, FIG. 8, and FIG. 9, in some embodiments, the outer sub-region Rso is a region where the orthographic projection of the respective anode RAD, the orthographic projection of the carrier transport blocking layer CTB, and an orthographic projection of the pixel definition layer PDL all overlaps. The inner sub-region Rsi is a region where the orthographic projection of the respective anode RAD overlaps with the orthographic projection of the carrier transport blocking layer CTB but does not overlap with the orthographic projection of the pixel definition layer PDL. In one example, the inner sub-region Rsi is defined by the inner edge Egi of the carrier transport blocking layer CTB and an inner pdl edge Egp of the pixel definition layer PDL. In another example, the outer sub-region Rso is defined by the inner pdl edge Egp of the pixel definition layer PDL and the outer edge Ego of the respective anode RAD. The pixel definition layer PDL is absent in the inner sub-region Rsi and at least partially present in the outer sub-region Rso.

Figure 10:
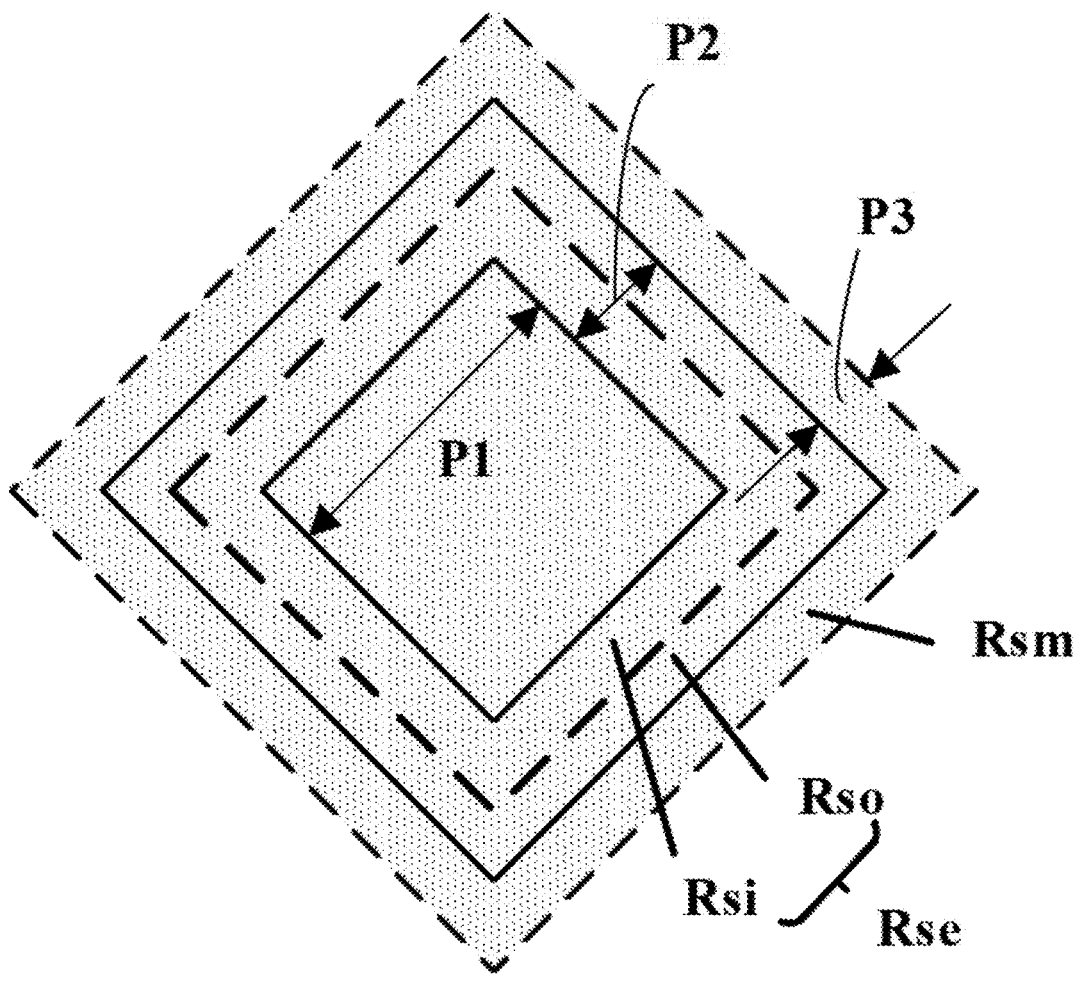
FIG. 10 is a plan view of several portions of an organic layer in some embodiments according to the present disclosure.

FIG. 10 is a plan view of several portions of an organic layer in some embodiments according to the present disclosure. Referring to FIG. 4 and FIG. 10, in some embodiments, the organic layer OL includes the first portion P1 in the respective subpixel region RSR and on a side of the anode layer ADL away from the base substrate BS, and a second portion P2 at least partially in a respective edge sub-region Rse surrounding the respective subpixel region RSR, the second portion P2 at least partially surrounding the first portion P1. Optionally, the second portion P2 surrounds the first portion P1.

In some embodiments, in the respective edge sub-region Rse, the carrier transport blocking layer CTB is stacked on the respective anode RAD, the second portion P2 is stacked on the carrier transport blocking layer CTB, the carrier transport blocking layer CTB electrically insulating the second portion P2 from the respective anode RAD, thereby at least partially blocking carrier transport in the second portion P2. In the present array substrate, by having the carrier transport blocking layer CTB between the second portion P2 from the respective anode RAD, carrier transport (e.g., hole transport) in the second portion P2 can be at least partially eliminated. When the light emitting diode is configured to emit light in the region corresponding to the first portion P1, undesirable light emission in the second portion P2 can be eliminated or at least reduced to a minimal level, due to the suppression of the carrier transport by the presence of the carrier transport blocking layer CTB. As shown in FIG. 3, the coffee ring in the array substrate according to the present disclosure is substantially eliminated, and color saturation is significantly enhanced.

Referring to FIG. 4, FIG. 9, and FIG. 10, in some embodiments, an orthographic projection of the carrier transport blocking layer CTB on the base substrate BS covers an orthographic projection of the second portion P2 on the base substrate BS. An orthographic projection of the respective anode PAD on the base substrate BS partially overlaps with the orthographic projection of the second portion P2 on the base substrate BS. In one example as shown in FIG. 4, FIG. 9, and FIG. 10, an orthographic projection of the pixel definition layer PDL on the base substrate BS partially overlaps with the orthographic projection of the second portion P2, on the base substrate BS.

In some embodiments, the second portion P2 is a ring structure substantially surrounding (e.g., at least 80%, at least 85%, at least 90%, at least 95%, at least 99%, or 100%) a periphery of the first portion P1 in the respective subpixel region RSR. Optionally, the third portion P3 substantially surrounding (e.g., at least 80%, at least 85%, at least 90%, at least 95% at least 99%, or 100%) an outer periphery of the second portion P2.

In some embodiments, the second portion P2 is limited in the respective edge sub-region Rse. The first portion P1 is limited in the respective subpixel region RSR.

Referring to FIG. 4 and FIG. 10, in some embodiments, the inter-subpixel region ISR further includes a middle sub-region Rsm. In some embodiments, the organic layer DL includes the first portion P1 in the respective subpixel region RSR and on a side of the anode layer ADL away from the base substrate BS; the second portion P2 at least partially in a respective edge sub-region Rse surrounding the respective subpixel region RSR, the second portion P2 at least partially surrounding the first portion P1; and a third portion P3 at least partially in the middle sub-region Rsm.

In some embodiments, the third portion P3 is limited in the middle sub-region Rsm.

Figure 11:
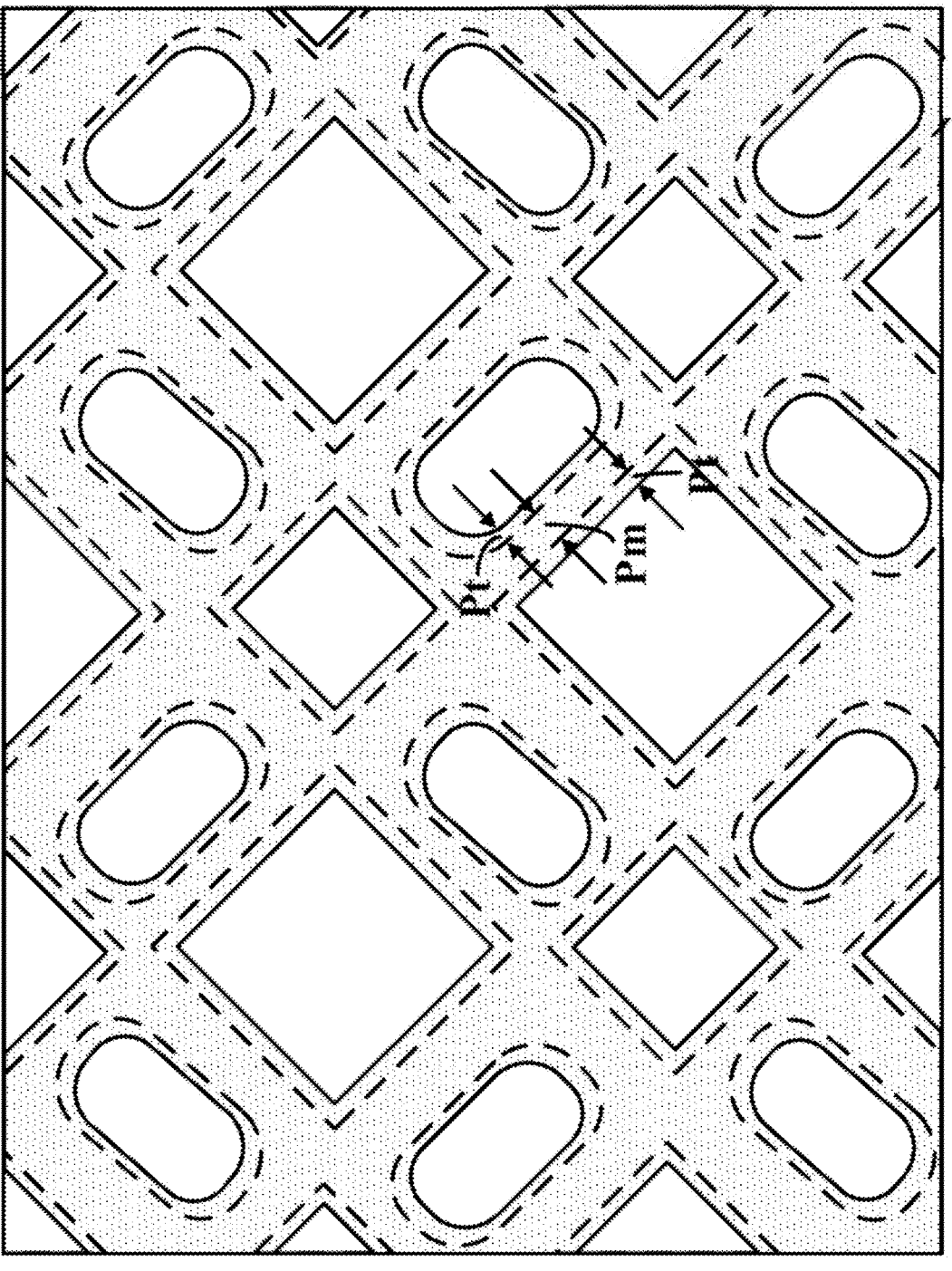
FIG. 11 is a plan view of a pixel definition layer in some embodiments according to the present disclosure.

FIG. 11 is a plan view of a pixel definition layer in some embodiments according to the present disclosure. Referring to FIG. 4 and FIG. 11, in some embodiments, the pixel definition layer PDL includes a tapered portion Pt at least partially in a respective edge sub-region Rse surrounding the respective subpixel region RSR. Optionally, the pixel definition layer PDL further includes a middle portion Pm. The middle portion Pun is between two tapered portions respectively adjacent to two adjacent subpixels.

In some embodiments, the tapered portion Pt is limited in the outer sub-region Rso and absent in the inner sub-region Rsi. In some embodiments, the middle portion Pm is limited in the middle sub-region Rsm.

In some embodiments, in the inter-subpixel region ISR, an orthographic projection of the carrier transport blocking layer CTB on the base substrate BS covers an orthographic projection of the pixel definition layer PDL on the base substrate BS. In some embodiments, the carrier transport blocking layer CTB is at least partially in the inner sub-region Rsi and at least partially in the outer sub-region Rso. In some embodiments, in the outer sub-region Rso, an orthographic projection of the carrier transport blocking layer CTB on the base substrate BS covers an orthographic projection of the tapered portion Pt on the base substrate BS.

In some embodiments, an orthographic projection of the middle portion Pin on the base substrate BS is non-overlapping with an orthographic projection of the anode layer ADL on the base substrate BS.

Figure 12A:
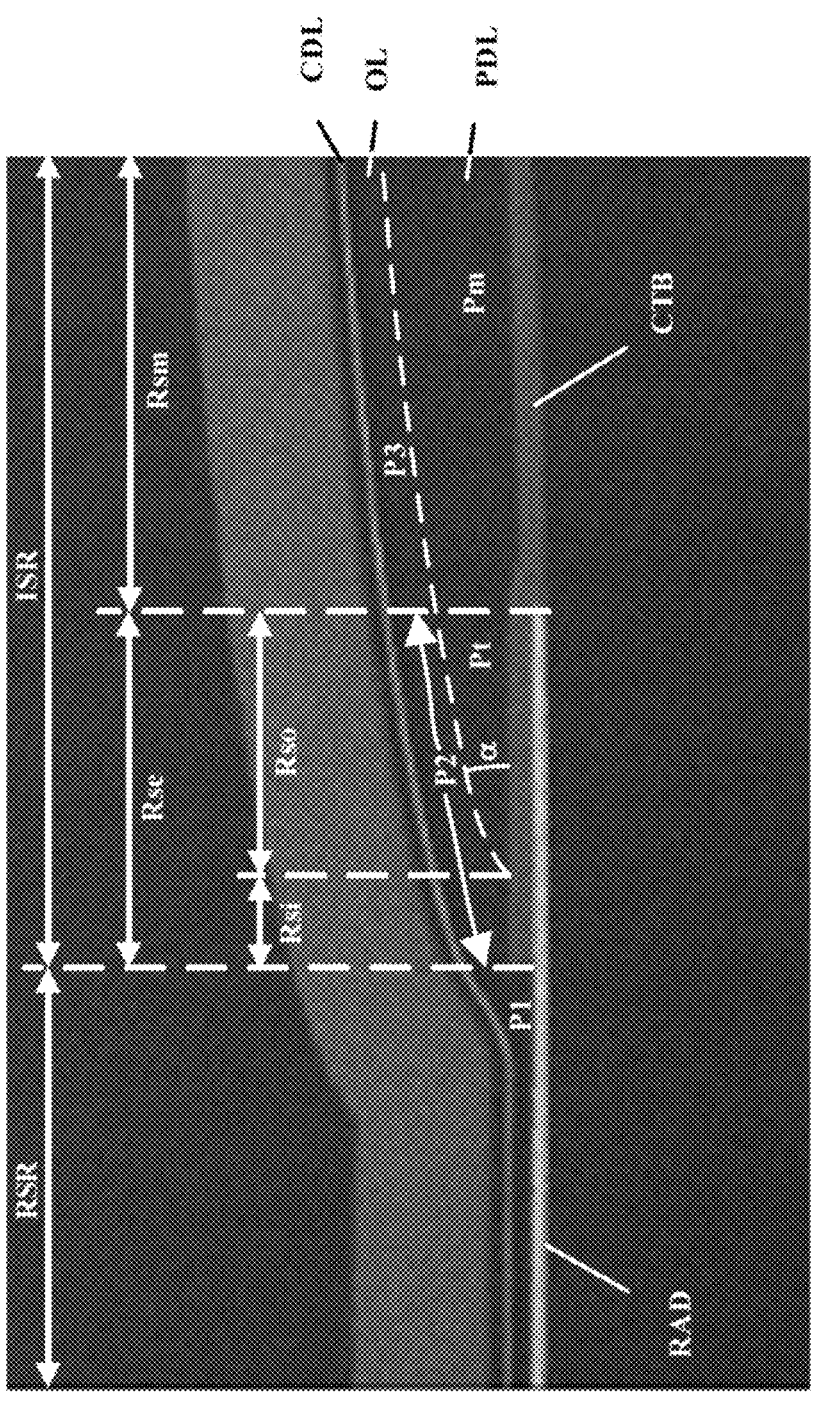
FIG. 12A is a focus ion beam image around a respective edge sub-region in an array substrate in some embodiments according to the present disclosure.

FIG. 12A is a focus ion beam image around a respective edge sub-region in an array substrate in some embodiments according to the present disclosure. Referring to FIG. 4 and FIG. 12A, in some embodiments, the second portion P2 is at least partially stacked on the tapered portion Pt in an outer sub-region Rso of the respective edge sub-region Rse, and at least partially stacked on the carrier transport blocking layer CTB in an inner sub-region Rsi of the respective edge sub-region Rse. In some embodiments, the third portion P3 is stacked on the middle portion Pm in the middle sub-region Rsm.

Figure 13A:
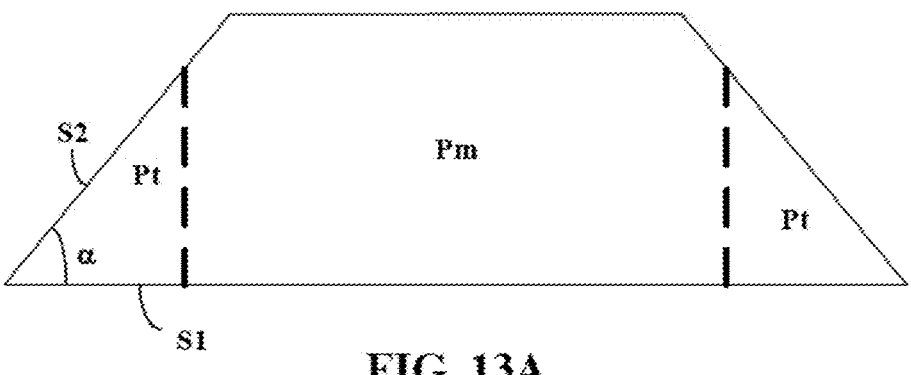
FIG. 13A is a schematic diagram illustrating the structure of a pixel definition layer in some embodiments according to the present disclosure.

FIG. 13A is a schematic diagram illustrating the structure of a pixel definition layer in some embodiments according to the present disclosure. Referring to FIG. 4, FIG. 12A, and FIG. 13A, the tapered portion Pt has a first surface S1 in contact with the carrier transport blocking layer CTB and a second surface S2 connected to the first surface S1, the second surface S2 in contact with the second portion P2 of the organic layer OL. Optionally, the first surface S1 and the second surface S2 are in the outer sub-region Rso.

As discussed above, typically the pixel definition layer is fabricated using a photoresist material. Due to non-uniformity of light intensity during exposure, the side walls of the pixel definition layer unavoidably is formed to have a slope of a relatively small slope angle. The flow of the photoresist material after the exposure process further contributes to formation of a slope of the small slope angle. In some embodiments, the second surface has an average slope angle with respect to the first surface of less than 60 degrees and greater than 1 degrees, for example, less than 60 degrees md greater than 1 degrees, less than 55 degrees and greater than 1 degrees, less than 50 degrees and greater than 1 degrees, less than 45 degrees and greater than 1 degrees, less than 40 degrees and greater than 1 degrees, less than 35 degrees and greater than 1 degrees, less than 30 degrees and greater than 1 degrees, less than 25 degrees and greater than 1 degrees, less than 20 degrees and greater than 1 degrees, less than 15 degrees and greater than 1 degrees, less than 10 degrees and greater than 1 degrees, less than 5 degrees md greater than 1 degrees, less than 60 degrees and greater than 5 degrees, less than 60 degrees and greater than 10 degrees, less than 60 degrees and greater than 15 degrees, less than 60 degrees and greater than 20 degrees, less than 60 degrees and greater than 25 degrees, less than 60 degrees and greater than 30 degrees, less than 60 degrees and greater than 35 degrees, less than 60 degrees and greater than 40 degrees, less than 60 degrees and greater than 45 degrees, less than 60 degrees and greater than 50 degrees, or less than 60 degrees and greater than 55 degrees. Optionally, the average slope angle is between 20 degrees and 45 degrees.

Figure 12B:
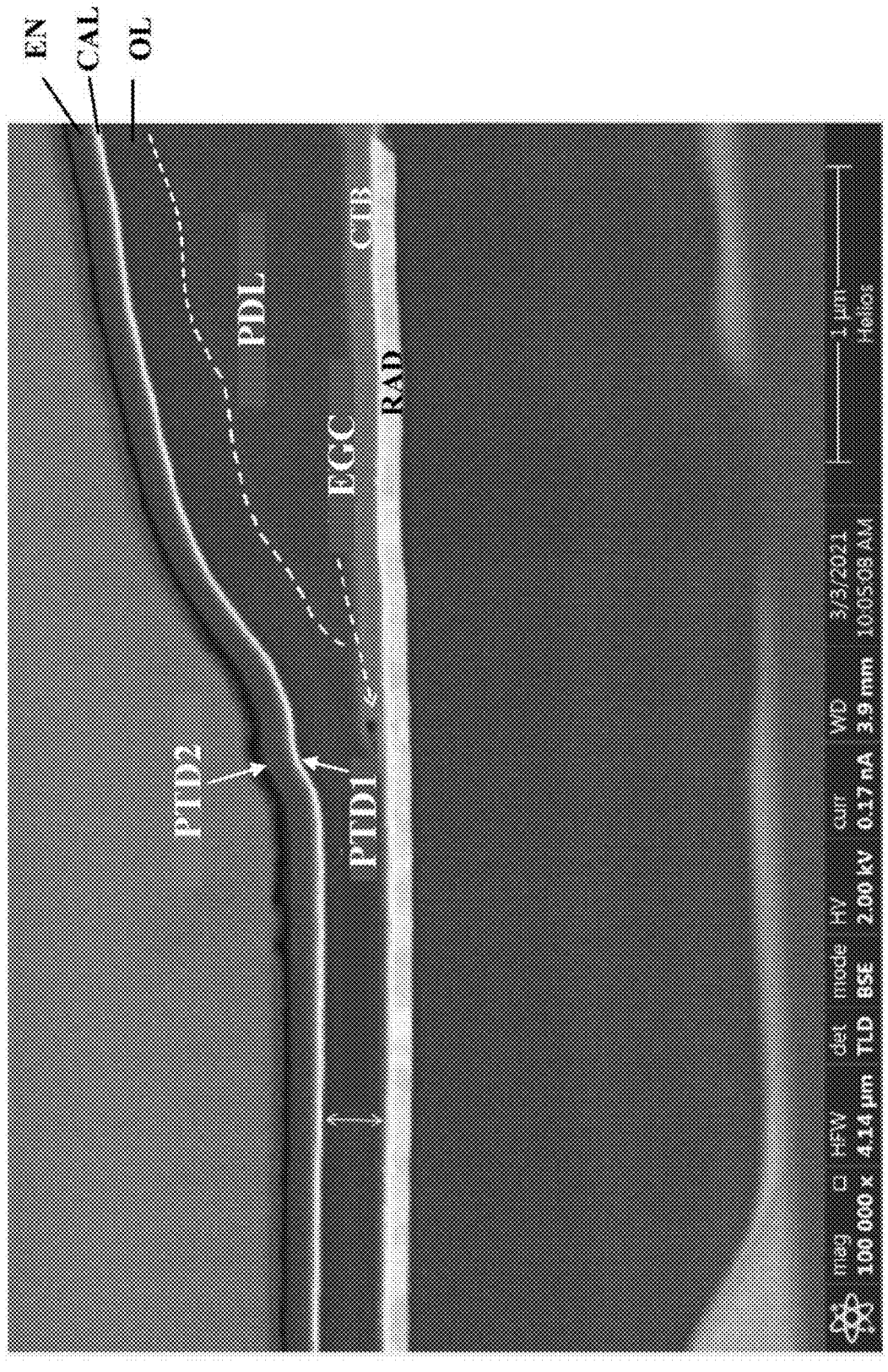
FIG. 12B is a zoom-in view of FIG. 12A.

FIG. 12B is a zoom-in view of FIG. 12A. Referring to FIG. 12A and FIG. 12B, in some embodiments, the array substrate further includes a cathode layer CDL on a side of the organic layer OL away from the base substrate BS. The cathode layer CDL has a protrusion PTD1, an orthographic projection of the protrusion PTD on the base substrate BS at least partially overlaps with an orthographic projection of an edge EGC of the carrier transport blocking layer CTB on the base substrate BS. The edge EGC is an edge of the carrier transport blocking layer CTB surrounding the respective subpixel region RSR.

In some embodiments, the array substrate further includes an encapsulating layer EN on a side of the cathode layer CDL away from the base substrate BS. The encapsulating layer EN has a protrusion PTD2, an orthographic projection of the protrusion PTD2 on the base substrate BS at least partially overlaps with an orthographic projection of an edge EGC of the carrier transport blocking layer CTB on the base substrate BS. The edge EGC is an edge of the carrier transport blocking layer CTB surrounding the respective subpixel region RSR.

In some embodiments, a respective sub-layer in the first portion P1 and a respective sub-layer in the second portion P2 have a substantially the same thickness along a direction perpendicular to the base substrate BS. Optionally, the first portion P1 and the second portion P2 have a same number of sub-layers and a same stacking sequence of sub-layers.

Figure 13B:
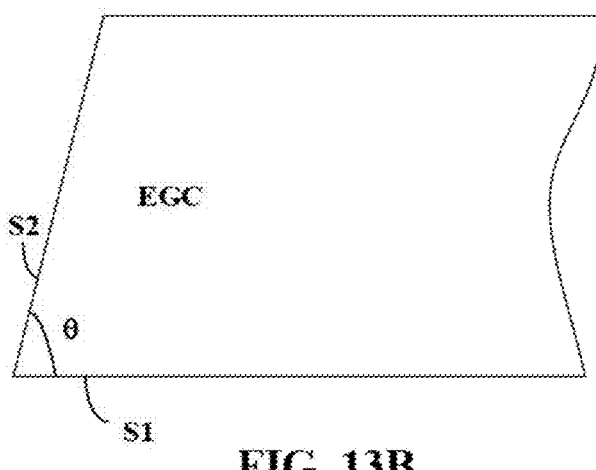
FIG. 13B is a schematic diagram illustrating the structure of an edge of the carrier transport blocking layer in some embodiments according to the present disclosure.

FIG. 13B is a schematic diagram illustrating the structure of an edge of the carrier transport blocking layer in some embodiments according to the present disclosure. Referring to FIG. 13B, in some embodiments, an edge EGC of the carrier transport blocking layer CTB surrounding the respective subpixel region RSR has a third surface S3 in contact with the respective anode RAD and a fourth surface S4 connected to the third surface S3, the fourth surface S4 in contact with the organic layer OL. In some embodiments, the fourth surface S4 has a second average slope angle θ with respect to the third surface S3 in a range of 70 degrees to 160 degrees, e.g., 70 degrees to 80 degrees, 80 degrees to 90 degrees, 90 degrees to 100 degrees, 100 degrees to 110 degrees, 110 degrees to 120 degrees, 120 degrees to 130 degrees, 130 degrees to 140 degrees, 140 degrees to 150 degrees, or 150 degrees to 160 degrees. In some embodiments, the second average slope angle θ in FIG. 13B is greater than the average slope angle α in FIG. 13A.

Referring to FIG. 4, in some embodiments, the organic layer OL includes at least one of an organic light emitting sub-layer EML; a hole transport sub-layer HTL; or an electron transport sub-layer ETL. Optionally, the organic layer OL includes at least one of an organic light emitting sub-layer EML; a prime sub-layer PR, a hole transport sub-layer HTL; or an electron transport sub-layer ETL.

In some embodiments, the organic layer OL includes at least an organic material sub-layer, a first sub-portion of the organic material sub-layer in the first portion P1, a second sub-portion of the organic material sub-layer in the second portion P2. The first sub-portion and the second sub-portion are at least partially discontinuous sub-portions at least partially segregated due to the presence of the carrier transport blocking layer CTB. Referring to FIG. 4 in one example, the organic material sub-layer is the organic light emitting sub-layer EML. The organic light emitting sub-layer EML is present in the first portion P1, at least partially present in the second portion P2, and at least partially absent in the third portion P3, In one example, the organic light emitting sub-layer EMIL is present in the first portion P1, partially present in the second portion P2, and absent in the third portion P3. The first sub-portion of the organic light emitting sub-layer EMIL in the first portion P1 and the second sub-portion of the organic light emitting sub-layer EML in the second portion P2 are at least partially discontinuous sub-portions at least partially segregated due to the presence of the carrier transport blocking layer CTB. In the cross-section as shown in FIG. 4, the first sub-portion of the organic light emitting sub-layer EML in the first portion P1 and the second sub-portion of the organic light emitting sub-layer EML in the second portion P2 are completely discontinuous sub-portions segregated due to the presence of the carrier transport blocking layer CTB.

Referring to FIG. 4, in another example, the organic material sub-layer is the prime sub-layer PR. The prime sub-layer PR is present in the first portion P1, at least partially present in the second portion P2, and at least partially absent in the third portion P3. In one example, the prime sub-layer PR is present in the first portion P1, partially present in the second portion P2, and absent in the third portion P3. The first sub-portion of the prime sub-layer PR in the first portion P1 and the second sub-portion of the prime sub-layer PR in the second portion P2 are at least partially discontinuous sub-portions at least partially segregated due to the presence of the carrier transport blocking layer CTB. In the cross-section as shown in FIG. 4, the first sub-portion of the prime sub-layer PR in the first portion P1 and the second sub-portion of the prime sub-layer PR in the second portion P2 are completely discontinuous sub-portions segregated due to the presence of the carrier transport blocking layer CTB.

Referring to FIG. 4, in another example, the organic material sub-layer is the hole transport sub-layer HTL. The hole transport sub-layer HTL is present in the first portion P1, at least partially present in the second portion P2, and at least partially present in the third portion P3. In one example, the hole transport sub-layer HTL is present in the first portion P1, present in the second portion P2, and present in the third portion P3. The first sub-portion of the hole transport sub-layer HTL in the first portion P1 and the second sub-portion of the hole transport sub-layer HTL in the second portion P2 are at least partially discontinuous sub-portions at least partially segregated due to the presence of the carrier transport blocking layer CTB. In the cross-section as shown in FIG. 4, the first sub-portion of the hole transport sub-layer HTL in the first portion P1 and the second sub-portion of the hole transport sub-layer HTL in the second portion P2 are completely discontinuous sub-portions segregated due to the presence of the carrier transport blocking layer CTB.

Referring to FIG. 4, in another example, the organic material sub-layer is the electron transport sub-layer ETL. The electron transport sub-layer ETL is present in the first portion P1, at least partially present in the second portion P2, and at least partially present in the third portion P3. In one example, the electron transport sub-layer ETL is present in the first portion P1, present in the second portion P2, and present in the third portion P3. The first sub-portion of the electron transport sub-layer ETL in the first portion P1 and the second sub-portion of the electron transport sub-layer ETL in the second portion P2 are at least partially discontinuous sub-portions at least partially segregated due to the presence of the carrier transport blocking layer CTB. In the cross-section as shown in FIG. 4, the first sub-portion of the electron transport sub-layer ETL in the first portion P1 and the second sub-portion of the electron transport sub-layer ETL in the second portion P2 are completely discontinuous sub-portions segregated due to the presence of the carrier transport blocking layer CTB.

In some embodiments, the hole transport sub-layer HTL is fabricated using an open mask, in which a hole transport organic material is deposited throughout a plurality of subpixels of different colors, over both a subpixel region and an inter-subpixel region of the array substrate. Accordingly, in some embodiments, the hole transport sub-layer HTL is present in the first portion P1, the second portion P2, and the third portion P3.

In some embodiments, the electron transport sub-layer ETL is fabricated using an open mask, in which an electron transport organic material is deposited throughout a plurality of subpixels of different colors, over both a subpixel region and an inter-subpixel region of the array substrate. Accordingly, in some embodiments, the electron transport sub-layer ETL is present in the first portion P1, the second portion P2, and the third portion P3.

In some embodiments, the organic light emitting sub-layer EMIL for subpixels of a specific color is fabricated using a mask plate specific for subpixels of the specific color, e.g., a fine metal mask plate specific for the subpixel of a specific color. Accordingly, in some embodiments, the organic light emitting sub-layer EML is present in the first portion P1, at least partially present in the second portion P2, and absent the third portion P3.

In some embodiments, the prime sub-layer PR for sub-pixels of a specific color is fabricated using a mask plate specific for subpixels of the specific color, e.g., a fine metal mask plate specific for the subpixel of a specific color. Accordingly, in some embodiments, the prime sub-layer PR is present in the first portion P1, at least partially present in the second portion P2, and absent the third portion P3.

In some embodiments, the first portion P1 includes multiple sub-layers. Optionally, the first portion P1 includes the organic light emitting sub-layer EML; the prime sub-layer PR, the hole transport sub-layer HTL; and the electron transport sub-layer ETL.

In some embodiments, the second portion P2 includes multiple sub-layers. Optionally, the second portion P2 includes the organic light emitting sub-layer EML; the prime sub-layer PR, the hole transport sub-layer HTL; and the electron transport sub-layer ETL.

In some embodiments, the third portion P3 includes multiple sub-layers. Optionally, the third portion P3 includes the hole transport sub-layer HTL and the electron transport sub-layer ETL.

In some embodiments, the array substrate further includes a cathode layer CDL on a side of the organic layer OL away from the base substrate BS. In some embodiments, the cathode layer CDL is fabricated using an open mask, in which a cathode material is deposited throughout a Plurality of subpixels of different colors, over both a subpixel region and an inter-subpixel region of the array substrate. Optionally, the cathode layer CDL has a unitary structure extending throughout at least a plurality of subpixels.

In some embodiments, the respective subpixel region RSR is defied by the carrier transport blocking layer CTB, e.g., defined by side walls or edges of the carrier transport blocking layer CTB. In some embodiments, the inter-subpixel region ISR is a region occupied by a combination of the carrier transport blocking layer CTB and the pixel definition layer PDL.

In some embodiments, the pixel definition layer includes an organic material. Optionally, the pixel definition layer includes an organic polymer material. Optionally, the pixel definition layer includes a photoresist material. Optionally, the pixel definition layer includes an organic photoresist polymer material.

Various appropriate carrier transport blocking materials may be used to fabricate the carrier transport blocking layer. In some embodiments, the carrier transport blocking layer includes an inorganic insulating material. Examples of appropriate carrier transport blocking materials include, but are not limited to, silicon oxide (SiOy), silicon nitride (SiNy, e.g., $Si_3N_4$), silicon oxynitride ($SiO_xN_y$).

In some embodiments, the pixel definition layer has a thickness in a range of 1.0 μm to 1.8 μm, e.g., 1.0 μm to 1.2 μm, 1.2 μm to 1.4 μm, 1.4 μm to 1.5 μm, or 1.6 μm to 1.8 μm.

In some embodiments, the carrier transport blocking layer has a thickness in a range of 0.8 μm to 1.4 μm, e.g., 0.8 μmto 0.9 μm, 0.9 μmto 1.0 μm, 1.0 μmto 1.1 μm, 1.1 μmto 1.2 μm, 1.2 μm to 1.3 μm, or 1.3 μm to 1.4 μm.

Figure 14:
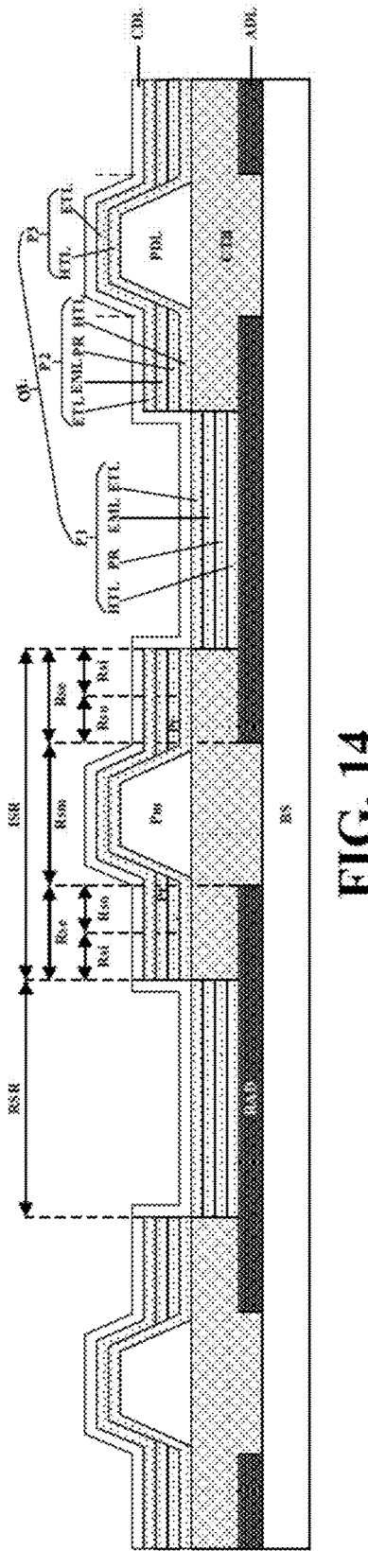
FIG. 14 is a cross-sectional view of an array substrate in some embodiments according to the present disclosure.

FIG. 14 is a cross-sectional view of an array substrate in some embodiments according to the present disclosure. Referring to FIG. 14, in some embodiments, an orthographic projection of the pixel definition layer PDL on the base substrate BS is non-overlapping with an orthographic projection of the anode layer ADL on the base substrate BS. In the respective edge sub-region Rse, an orthographic projection of the respective anode RAD on the base substrate partially overlaps with an orthographic projection of the carrier transport blocking layer CTB on the base substrate BS, the pixel definition layer PDL is outside the respective edge sub-region Rse.

Figure 15A:
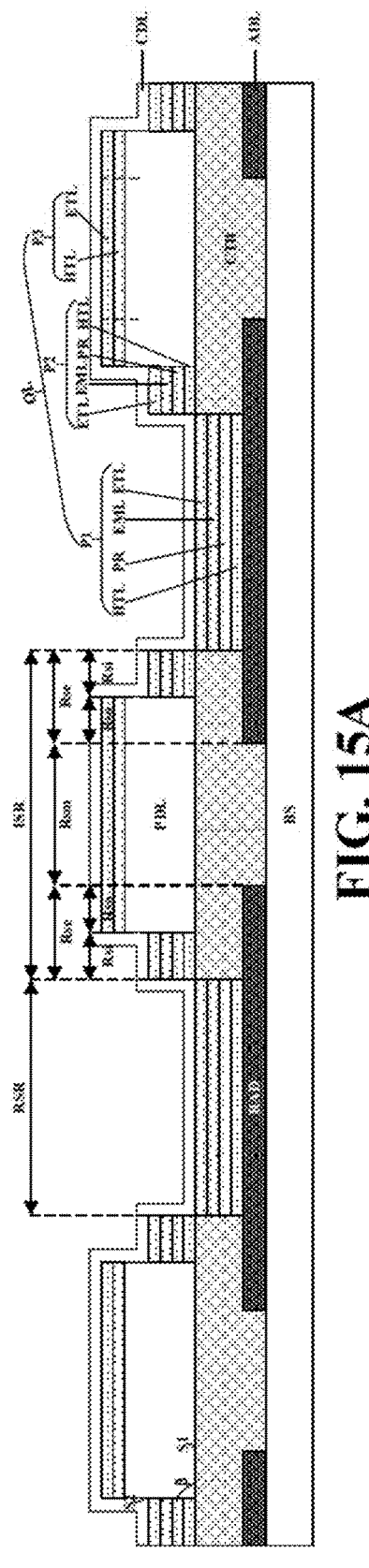
FIG. 15A is a cross-sectional view of an array substrate in some embodiments according to the present disclosure.

FIG. 15A is a cross-sectional view of an array substrate in some embodiments according to the present disclosure. Referring to FIG. 15A, the organic layer OL further includes a second portion P2 on top of the carrier transport blocking layer CTB and a third portion P3 on top of the pixel definition layer. The pixel definition layer PDL in some embodiments may be made to have a large slope angle. In one example, the pixel definition layer PDL is fabricated using an inorganic material, accordingly the slope angle of the pixel definition layer PDL may be made to be large, e.g., having a steep slope. In some embodiments, the pixel definition layer PDL has a first surface S1 in contact with the carrier transport blocking layer CTB and a second surface S2 connected to the first surface S1, the second surface S2 being in contact with the second portion P2. In some embodiments, the second surface has an average slope angle β with respect to the first surface of greater 30 degrees and less than 150 degrees, for example, 30 degrees to 40 degrees, 40 degrees to 50 degrees, 50 degrees to 60 degrees, 60 degrees to 70 degrees, 70 degrees to 80 degrees, 80 degrees to 90 degrees, 90 degrees to 100 degrees, 100 degrees to 110 degrees, 110 degrees to 120 degrees, 120 degrees to 130 degrees, 130 degrees to 140 degrees, or 140 degrees to 150 degrees.

Figure 15B:
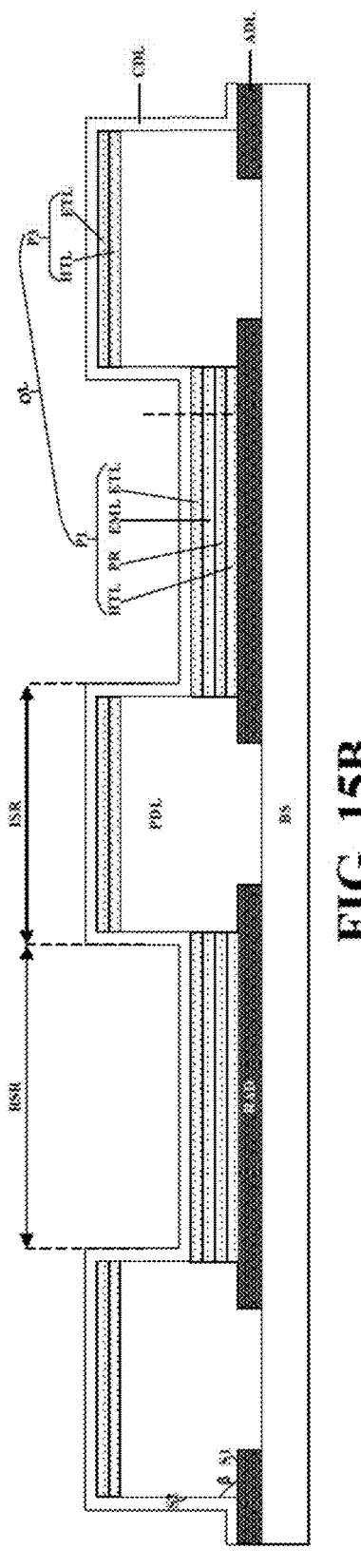
FIG. 15B is a cross-sectional view of an array substrate in some embodiments according to the present disclosure.

FIG. 15B is a cross-sectional view of an array substrate in some embodiments according to the present disclosure. Referring to FIG. 15B, the array substrate includes a pixel definition layer PDL fabricated using an inorganic material, and having a large slope, e.g., having a steep slope. Accordingly, in some embodiments, the carrier transport blocking layer CTB is not required to eliminate the carrier transport in the edge portion of the organic layer OL. In some embodiments, the pixel definition layer PDL has a first surface S1 in contact with the respective anode RAD and a second surface S2 connected to the first surface S1, the second surface S2 being in contact with the cathode layer CDL. In some embodiments, the second surface has an average slope angle β with respect to the first surface of greater 30 degrees and less than 150 degrees, for example, 30 degrees to 40 degrees, 40 degrees to 50 degrees, 50 degrees to 60 degrees, 60 degrees to 70 degrees, 70 degrees to 80 degrees, 80 degrees to 90 degrees, 90 degrees to 100 degrees, 100 degrees to 110 degrees, 110 degrees to 120 degrees, 120 degrees to 130 degrees, 130 degrees to 140 degrees, or 140 degrees to 150 degrees.

In some embodiments, the organic layer OL further includes a third portion P3 on top of the pixel definition layer PDL, In some embodiments, the organic layer OL includes at least an organic material sub-layer (e.g., the hole transport layer HTL or the electron transport layer ETL), a first sub-portion of the organic material sub-layer in the first portion P1, a second sub-portion of the organic material sub-layer in the second portion P2, and a third sub-portion of the organic material sub-layer in the third portion P3. Optionally, the first sub-portion and the second sub-portion are at least partially discontinuous sub-portions at least partially segregated due to presence of the carrier transport blocking layer CTB. Optionally, the second sub-portion and the third sub-portion are at least partially discontinuous sub-portions at least partially segregated due to presence of the pixel definition layer PDL (due to the large slope angle of the pixel definition layer PDL).

Figure 16:
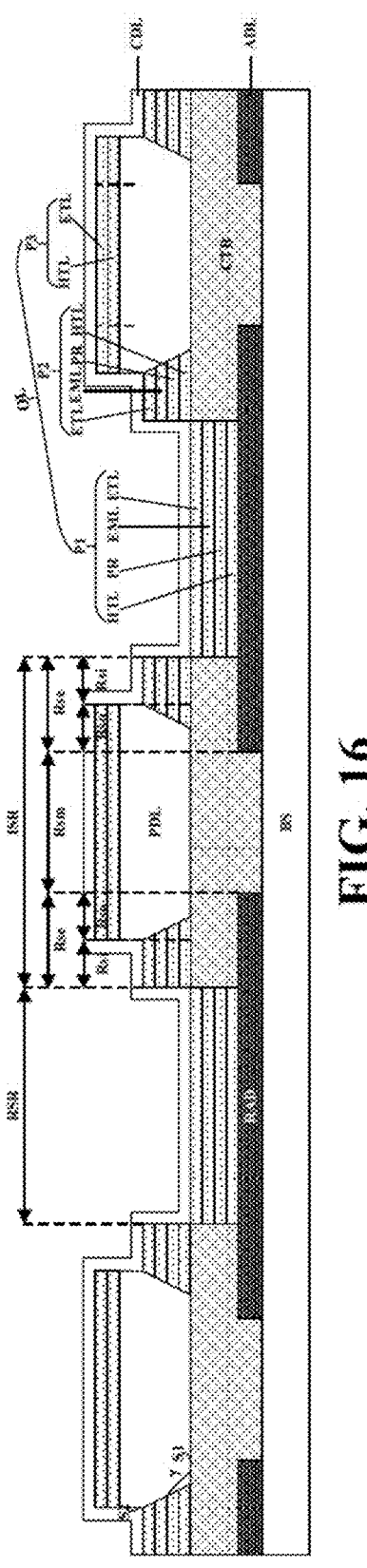
FIG. 16 is a cross-sectional view of an array substrate in some embodiments according to the present disclosure.

FIG. 16 is a cross-sectional view of an array substrate in some embodiments according to the present disclosure.

Referring to FIG. 16, in some embodiments, the pixel definition layer PDL has a first surface S1 in contact with the carrier transport blocking layer CTB and a second surface S2 connected to the first surface S1, the second surface S2 being in contact with the second portion P2. In some embodiments, the second surface has an average slope angle γ with respect to the first surface, and the slope angle γ is an obtuse angle greater than 90 degrees. An orthographic projection of a top portion of the pixel definition layer PDL (e.g., a surface of the pixel definition layer PDL on a side away firm the base substrate BS) on the base substrate BS covers an orthographic projection of a bottom portion of the pixel definition layer PDL (e.g., a surface of the pixel definition layer PDL on a side closer to the base substrate BS) on the base substrate BS. In a cross-section along a plane intersecting two adjacent subpixel regions and perpendicular to the base substrate BS, at least a portion (e.g. the bottom portion) of the pixel definition layer PDL has an inverted trapezoidal shape. As used herein, "trapezoidal shape" or "inverted trapezoidal shape" can include shapes or geometries having at least one pair of substantially parallel sides (regardless of whether the other two sides include straight lines, curved lines or otherwise). As used herein, the term "substantially parallel sides" refers to two sides forming an included angle in a range of 0 degree to approximately 15 degrees, e.g., 0 degree to approximately 1 degree, approximately 1 degree to approximately 2 degrees, approximately 2 degree to approximately 5 degrees, approximately 5 degree to approximately 10 degrees, or approximately 10 degrees to approximately 15 degrees. Optionally, the at least one pair of substantially parallel sides of the substantially trapezoidal shape includes a shorter side and a longer side, wherein the longer side is closer to the base substrate. Optionally, the at least one pair of substantially parallel sides of the substantially inverted trapezoidal shape includes a shorter side and a longer side, wherein the shorter side is closer to the base substrate.

Figure 17A:
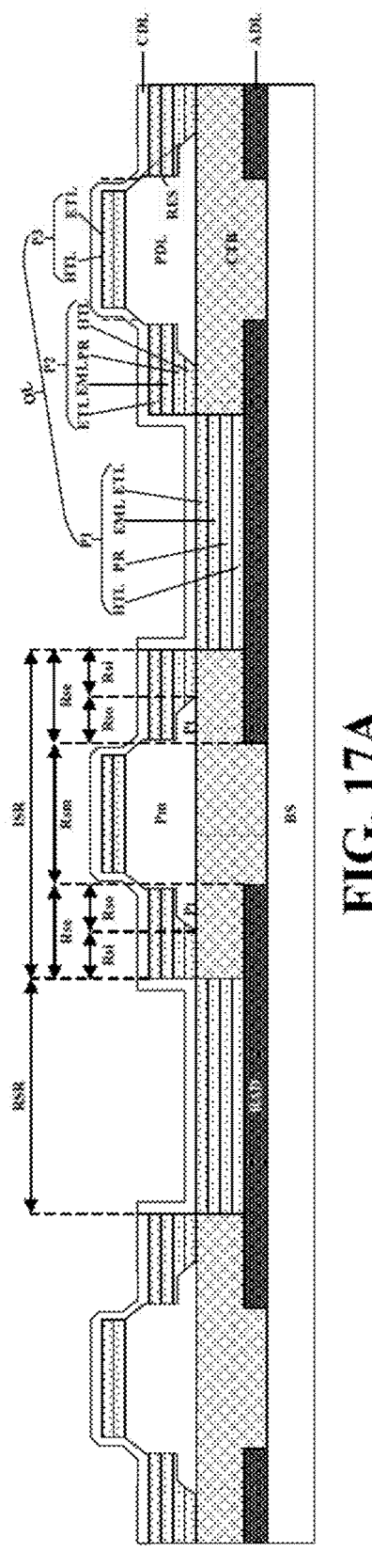
FIG. 17A is a cross-sectional view of an array substrate in some embodiments according to the present disclosure.

FIG. 17A is a cross-sectional view of an army substrate in some embodiments according to the present disclosure. In some embodiments, the pixel definition layer PDL is formed to have a recess RES recessing into at least a portion of the pixel definition layer PDL (for example, the tapered portion Pt). In the process of depositing organic material, the presence of the recess RES further facilitates segregation of the second sub-portion from the third sub-portion. Accordingly, in some embodiments, the organic layer OL further includes second portion P2 at least partially in the recess RES, and a third portion P3 on top of the pixel definition layer PDL. In some embodiments, the organic layer OL includes at least an organic material sub-layer (e.g., the hole transport layer HTL or the electron transport layer ETL), a first sub-portion of the organic material sub-layer in the first portion P1, a second sub-portion of the organic material sub-layer in the second portion P2, and a third sub-portion of the organic material sub-layer in the third portion P3. Optionally, the first sub-portion and the second sub-portion are at least partially discontinuous sub-portions at least partially segregated due to presence of the carrier transport blocking layer CTB. Optionally, the second sub-portion and the third sub-portion are at least partially discontinuous sub-portions at least partially segregated due to presence of the recess RES in the pixel definition layer PDL.

Figure 17B:
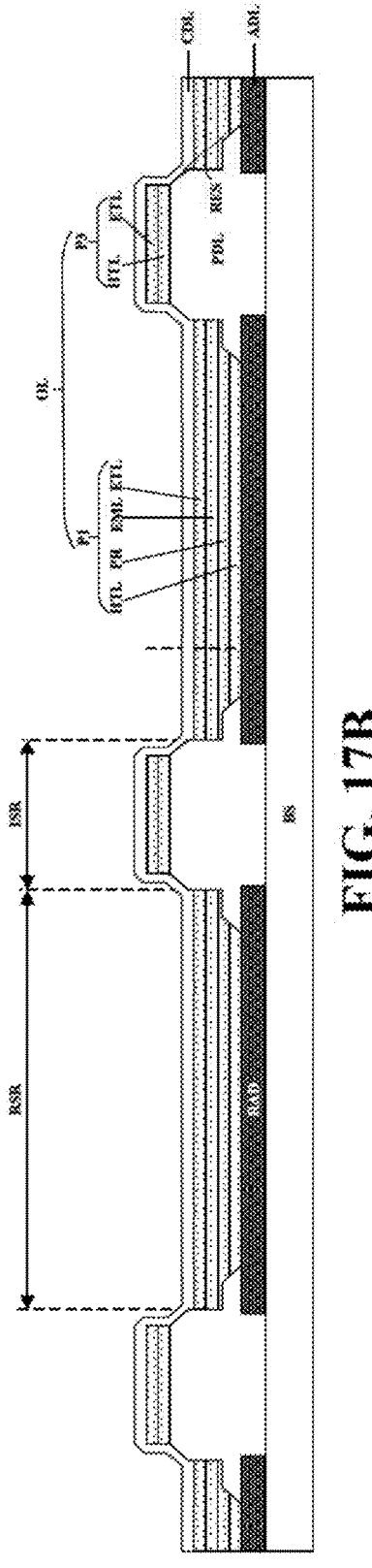
FIG. 17B is a cross-sectional view of an array substrate in some embodiments according to the present disclosure.

FIG. 17B is a cross-sectional view of an array substrate in some embodiments according to the present disclosure. Referring to FIG. 17B, the pixel definition layer PDL is formed to have a recess RES recessing into at least a portion of the pixel definition layer PDL (for example, the tapered portion Pt). In the process of depositing organic material, the presence of the recess RES further facilitates segregation of the second sub-portion from the third sub-portion. Accordingly, in some embodiments, the first portion P1 is at least partially in the recess RES, and the organic layer OL further includes a third portion P3 on top of the pixel definition layer PDL. In some embodiments, the organic layer OL includes at least an organic material sub-layer (e.g., the hole transport layer HTL or the electron transport layer ETL), a first sub-portion of the organic material sub-layer in the first portion P1, and a third sub-portion of the organic material sub-layer in the third portion P3. Optionally, the first sub-portion and the third sub-portion are at least partially discontinuous sub-portions at least partially segregated due to presence of the recess RES in the pixel definition layer PDL. Accordingly, in some embodiments, the carrier transport blocking layer CTB is not required to eliminate the carrier transport in the edge portion of the organic layer OL.

Figure 18:
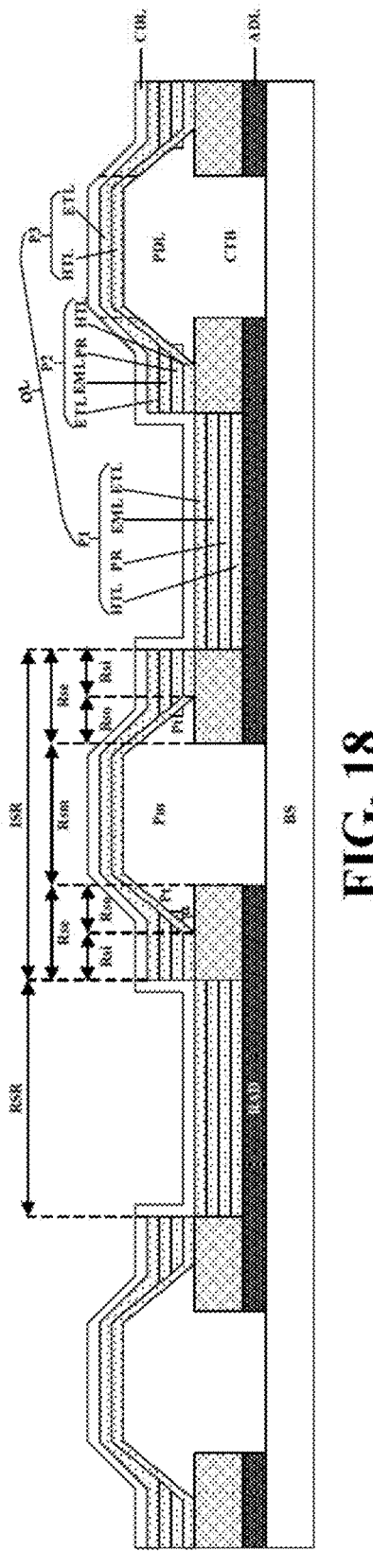
FIG. 18 is a cross-sectional view of an array substrate in some embodiments according to the present disclosure.
Figure 19:
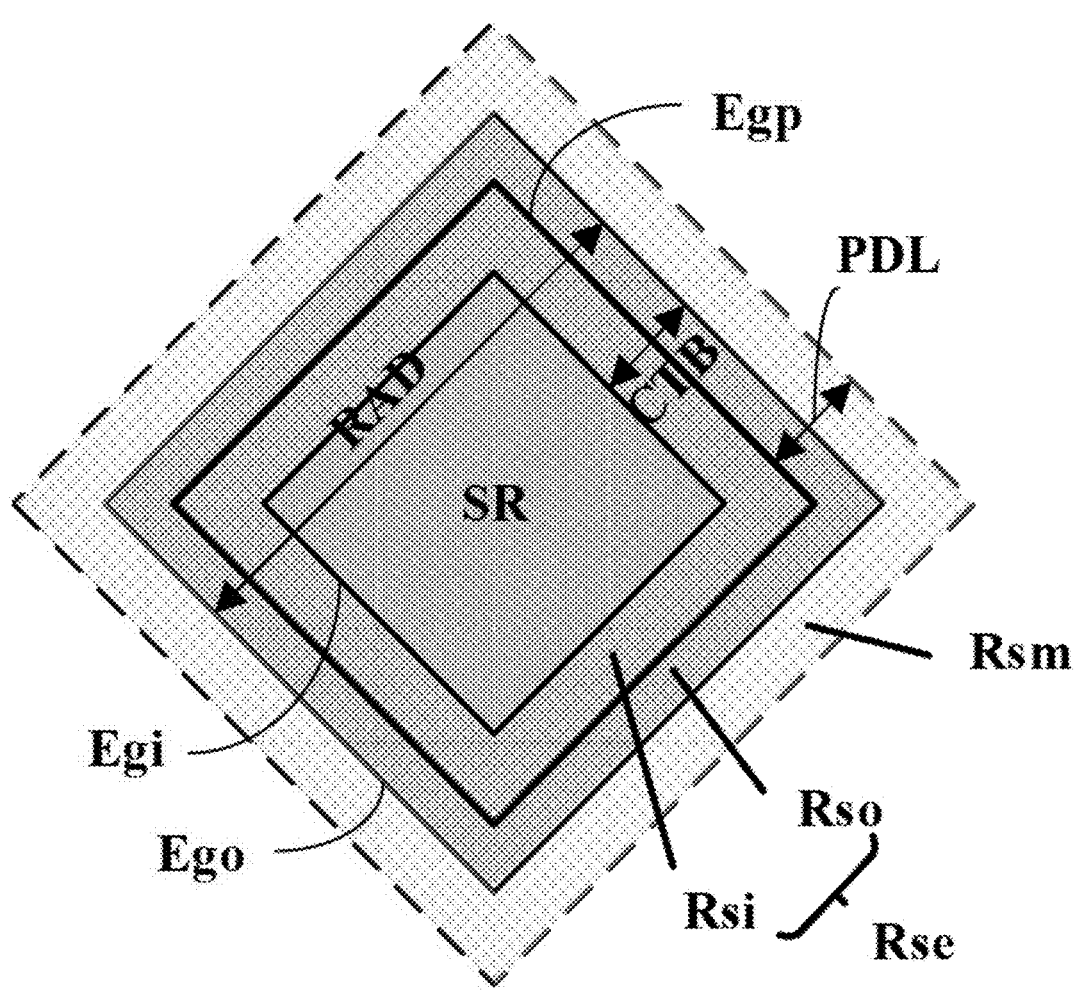
FIG. 19 is a plan view of a respective anode and a carrier transport blocking layer in a respective edge sub-region in some embodiments according to the present disclosure.

FIG. 18 is a cross-sectional view of an array substrate in some embodiments according to the present disclosure. FIG. 19 is a plan view of a respective anode and a carrier transport blocking layer in a respective edge sub-region in some embodiments according to the present disclosure. Referring to FIG. 18, in some embodiments, the carrier transport blocking layer CTB is limited in the plurality of edge sub-regions. In some embodiments, an orthographic projection of the anode layer ADL on the base substrate BS covers an orthographic projection of the carrier transport blocking layer CTB on the base substrate BS. Optionally, an orthographic projection of at least a portion (e.g., the middle portion Pm) of the pixel definition layer PDL on the base substrate BS is non-overlapping with the orthographic projection of the carrier transport blocking layer CTB on the base substrate BS.

Figure 20:
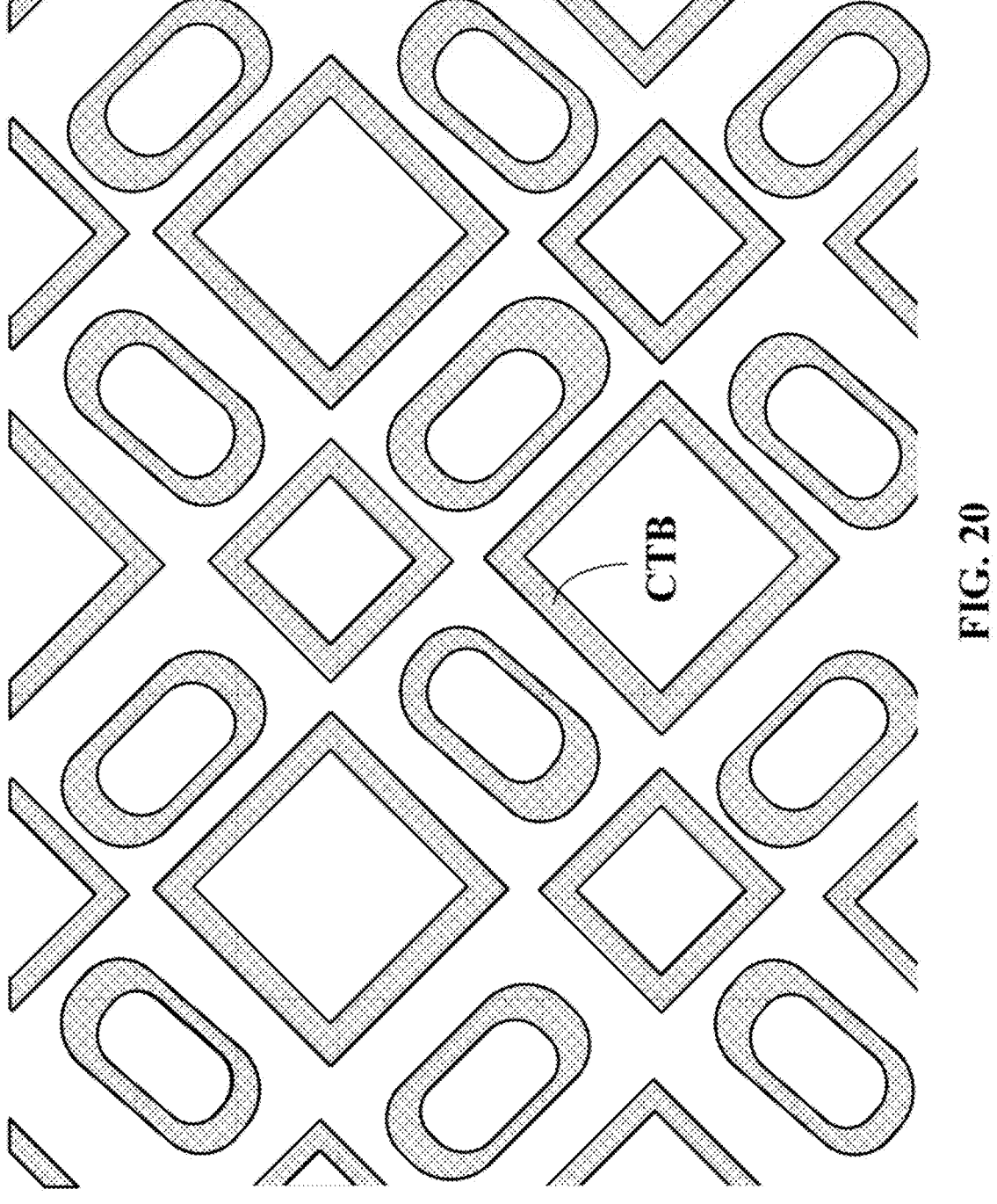
FIG. 20 illustrates a superimposition of a cattier transport blocking layer and a pixel definition layer in an array substrate in some embodiments according to the present disclosure.

FIG. 20 illustrates a superimposition of a carrier transport blocking layer and a pixel definition layer in an array substrate in some embodiments according to the present disclosure. In some embodiments, the carrier transport blocking layer CTB includes a plurality of ring structures as depicted in FIG. 20. Optionally, the plurality of ring structures are spaced apart from each other by the pixel definition layer PDL.

In some embodiments, the carrier transport blocking layer has a single layer structure.

In some embodiments, the carrier transport blocking layer includes multiple sub-layers. Optionally, the carrier transport blocking layer includes at least one sub-layer made of an inorganic material. Optionally, the carrier transport blocking layer includes at least one sub-layer made of an organic material. Optionally, the carrier transport blocking layer includes at least one inorganic sub-layer and at least one organic sub-layer. Optionally, the carrier transport blocking layer includes at least one sub-layer made of an insulating material. Optionally, the carrier transport blocking layer includes at least one sub-layer made of a conductive material. Optionally, the carrier transport blocking layer includes at least one sub-layer made of a semiconductive material.

In some embodiments, die array substrate further includes an auxiliary carrier transport blocking layer on a side of the carrier transport blocking layer away from the base substrate.

In another aspect, the present disclosure provides a display apparatus, including the array substrate described herein or fabricated by a method described herein, and one or more integrated circuits connected to the array substrate. Examples of appropriate display apparatuses include, but are not limited to, an electronic paper, a mobile phone, a tablet computer, a television, a monitor, a notebook computer, a digital album, a GPS, etc. Optionally, the display apparatus is an organic light emitting diode display apparatus.

In another aspect, the present disclosure provides a method of fabricating an array substrate comprising a plurality of subpixels, a respective subpixel comprising a respective light emitting diode. In some embodiments, the method includes forming an anode layer comprising a plurality of anodes on the base substrate, a respective anode being at least partially in a respective subpixel region: forming a carrier transport blocking layer on a side of the anode layer away from the base substrate, the carrier transport blocking layer being in an inter-subpixel region; forming a pixel definition layer on a side of the carrier transport blocking layer away from the base substrate, the pixel definition layer being in the inter-subpixel region; and forming an organic layer comprising at least a first portion in the respective subpixel region and on a side of the anode layer away from the base substrate.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element, Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate comprising a plurality of subpixels, a respective subpixel comprising a respective light emitting diode;

the array substrate comprises:

a base substrate;

an anode layer comprising a plurality of anodes on the base substrate, a respective anode being at least partially in a respective subpixel region;

a carrier transport blocking layer on a side of the anode layer away from the base substrate, the carrier transport blocking layer at least partially blocking carrier transport;

a pixel definition layer on a side of the carrier transport blocking layer away from the base substrate, the pixel definition layer defining subpixel apertures, a respective subpixel aperture exposing at least a portion of the respective anode; and an organic layer comprising at least a first portion in the respective subpixel region and on a side of the anode layer away from the base substrate;

wherein an orthographic projection of the pixel definition layer on the base substrate at least partially overlaps with an orthographic projection of the carrier transport blocking layer on the base substrate;

the orthographic projection of the carrier transport blocking layer on the base substrate at least partially overlaps with an orthographic projection of the anode layer on the base substrate;

an area where the orthographic projection of the carrier transport blocking layer on the base substrate overlaps with the orthographic projection of the anode layer on the base substrate is greater than an area where the orthographic projection of the pixel definition layer on the base substrate overlaps with the orthographic projection of the anode layer on the base substrate;

the organic layer further comprises a second portion at least partially in a respective edge sub-region surrounding the respective subpixel region, the second portion at least partially surrounding the first portion;

in the respective edge sub-region, the carrier transport blocking layer is stacked on the respective anode, the second portion is stacked on the carrier transport blocking layer, the carrier transport blocking layer electrically insulating the second portion from the respective anode, thereby at least partially blocking carrier transport in the second portion;

the organic layer comprises at least an organic material sub-layer, a first sub-portion of the organic material sub-layer in the first portion, a second sub-portion of the organic material sub-layer in the second portion;

the first sub-portion and the second sub-portion are in a same sub-layer and comprise a same material;

the first sub-portion and the second sub-portion are at least partially segregated from each other at an edge of the carrier transport blocking layer;

an orthographic projection of at least a part of the second sub-portion on the base substrate is non-overlapping with the orthographic projection of the pixel definition layer on the base substrate, and at least partially overlaps with the orthographic projection of the carrier transport blocking layer on the base substrate; and the first sub-portion and the second sub-portion are in contact with the carrier transport blocking layer.

2. The array substate of claim 1, comprising an inter-subpixel region;

wherein the inter-subpixel region comprises a plurality of edge sub-regions, a respective edge sub-region surrounding the respective subpixel region; and in the respective edge sub-region, an orthographic projection of the respective anode on the base substrate partially overlaps with an orthographic projection of the carrier transport blocking layer on the base substrate, and partially overlaps with an orthographic projection of the pixel definition layer on the base substrate.

3. The array substrate of claim 2, wherein the respective edge sub-region comprises an inner sub-region surrounding the respective subpixel region, and an outer sub-region surrounding the inner sub-region; and the pixel definition layer is present in the outer sub-region and absent in the inner sub-region.

4. The array substrate of claim 1, wherein the organic layer further comprises a second portion at least partially in a respective edge sub-region surrounding the respective subpixel region, the second portion at least partially surrounding the first portion; and in the respective edge sub-region, the carrier transport blocking layer is stacked on the respective anode, the second portion is stacked on the carrier transport blocking layer, the carrier transport blocking layer electrically insulating the second portion from the respective anode, thereby at least partially blocking carrier transport in the second portion.

5. The array substrate of claim 4, wherein an orthographic projection of the carrier transport blocking layer on the base substrate covers an orthographic projection of the second portion on the base substrate; and an orthographic projection of the respective anode on the base substrate partially overlaps with the orthographic projection of the second portion on the base substrate.

6. The array substrate of claim 4, wherein an orthographic projection of the first sub-portion on the base substrate is non-overlapping with the orthographic projection of the carrier transport blocking layer on the base substrate.

7. The array substrate of claim 1, wherein the pixel definition layer comprises a tapered portion at least partially in a respective edge sub-region surrounding the respective subpixel region;

the tapered portion has a first surface in contact with the carrier transport blocking layer and a second surface connected to the first surface, the second surface in contact with a second portion of the organic layer; and the second surface has an average slope angle with respect to the first surface of less than 60 degrees and greater than 1 degrees.

8. The array substrate of claim 7, wherein the organic layer further comprises a second portion at least partially in a respective edge sub-region surrounding the respective subpixel region; and the second portion is at least partially stacked on the tapered portion in an outer sub-region of the respective edge sub-region, and at least partially stacked on the carrier transport blocking layer in an inner sub-region of the respective edge sub-region.

9. The array substrate of claim 1, wherein the orthographic projection of the anode layer on the base substrate is non-overlapping with the orthographic projection of the pixel definition layer on the base substrate.

10. The array substrate of claim 1, wherein the organic layer further comprises a second portion on a side of the carrier transport blocking layer away from the base substrate;

the pixel definition layer has a first surface in contact with the carrier transport blocking layer and a second surface connected to the first surface, the second surface being in contact with the second portion; and the second surface has an average slope angle with respect to the first surface of greater 30 degrees and less than 150 degrees.

11. The array substrate of claim 10, wherein the organic layer further comprises a third portion on a side of the pixel definition layer away from the base substrate;

the organic layer comprises at least an organic material sub-layer, a first sub-portion of the organic material sub-layer in the first portion, a second sub-portion of the organic material sub-layer in the second portion, and a third sub-portion of the organic material sub-layer in the third portion;

the first sub-portion, the second sub-portion, and the third sub-portion are in a same sub-layer and comprise a same material;

the second sub-portion and the third sub-portion are at least partially segregated from each other at an edge of the pixel definition layer.

12. The array substrate of claim 1, wherein an orthographic projection of a surface of the pixel definition layer on a side away from the base substrate on the base substrate covers an orthographic projection of a surface of the pixel definition layer on a side closer to the base substrate on the base substrate; and in a cross-section along a plane intersecting two adjacent subpixel regions and perpendicular to the base substrate, at least a portion of the pixel definition layer has an inverse trapezoidal shape.

13. The array substrate of claim 1, comprising a recess recessing into at least a portion of the pixel definition layer;

the organic layer further comprises second portion at least partially in the recess and a third portion on top of the pixel definition layer;

the organic layer comprises at least an organic material sub-layer, a first sub-portion of the organic material sub-layer in the first portion, a second sub-portion of the organic material sub-layer in the second portion, and a third sub-portion of the organic material sub-layer in the third portion;

the first sub-portion and the second sub-portion are at least partially discontinuous sub-portions at least partially segregated due to presence of the carrier transport blocking layer; and the second sub-portion and the third sub-portion are at least partially discontinuous sub-portions at least partially segregated due to presence of the recess.

14. The array substrate of claim 1, wherein an orthographic projection of the anode layer on the base substrate covers an orthographic projection of the carrier transport blocking layer on the base substrate; and an orthographic projection of at least a portion of the pixel definition layer on the base substrate is non-overlapping with the orthographic projection of the carrier transport blocking layer on the base substrate.

15. The array substate of claim 1, comprising an inter-subpixel region;

wherein the inter-subpixel region comprises a plurality of edge sub-regions, a respective edge sub-region surrounding the respective subpixel region; and the carrier transport blocking layer is limited to the plurality of edge sub-regions.

16. The array substrate of claim 1, wherein the carrier transport blocking layer includes a plurality of ring structures spaced apart from each other by the pixel definition layer.

17. The array substrate of claim 1, further comprising a cathode layer on a side of the organic layer away from the base substrate;

the cathode layer has a protrusion, an orthographic projection of the protrusion on the base substrate at least partially overlaps with an orthographic projection of an edge of the carrier transport blocking layer on the base substrate; and the edge is an edge of the carrier transport blocking layer surrounding the respective subpixel region.

18. The array substrate of claim 1, further comprising an encapsulating layer on a side of the cathode layer away from the base substrate;

the encapsulating layer has a protrusion, an orthographic projection of the protrusion on the base substrate at least partially overlaps with an orthographic projection of an edge of the carrier transport blocking layer on the base substrate; and the edge is an edge of the carrier transport blocking layer surrounding the respective subpixel region.

19. A display apparatus, comprising the array substrate of claim 1, and one or more integrated circuits connected to the array substrate.

20. A method of fabricating an array substrate comprising a plurality of subpixels, a respective subpixel comprising a respective light emitting diode, comprising:

forming an anode layer comprising a plurality of anodes on a base substrate, a respective anode being at least partially in a respective subpixel region;

forming a carrier transport blocking layer on a side of the anode layer away from the base substrate, the carrier transport blocking layer at least partially blocking carrier transport;

forming a pixel definition layer on a side of the carrier transport blocking layer away from the base substrate, the pixel definition layer defining subpixel apertures, a respective subpixel aperture exposing at least a portion of the respective anode; and forming an organic layer comprising at least a first portion in the respective subpixel region and on a side of the anode layer away from the base substrate;

wherein an orthographic projection of the pixel definition layer on the base substrate at least partially overlaps with an orthographic projection of the carrier transport blocking layer on the base substrate;

the orthographic projection of the carrier transport blocking layer on the base substrate at least partially overlaps with an orthographic projection of the anode layer on the base substrate; and an area where the orthographic projection of the carrier transport blocking layer on the base substrate overlaps with the orthographic projection of the anode layer on the base substrate is greater than an area where the orthographic projection of the pixel definition layer on the base substrate overlaps with the orthographic projection of the anode layer on the base substrate;

the organic layer further comprises a second portion at least partially in a respective edge sub-region surrounding the respective subpixel region, the second portion at least partially surrounding the first portion;

in the respective edge sub-region, the carrier transport blocking layer is stacked on the respective anode, the second portion is stacked on the carrier transport blocking layer, the carrier transport blocking layer electrically insulating the second portion from the respective anode, thereby at least partially blocking carrier transport in the second portion;

the organic layer comprises at least an organic material sub-layer, a first sub-portion of the organic material sub-layer in the first portion, a second sub-portion of the organic material sub-layer in the second portion;

the first sub-portion and the second sub-portion are in a same sub-layer and comprise a same material;

the first sub-portion and the second sub-portion are at least partially segregated from each other at an edge of the carrier transport blocking layer;

an orthographic projection of at least a part of the second sub-portion on the base substrate is non-overlapping with the orthographic projection of the pixel definition layer on the base substrate, and at least partially overlaps with the orthographic projection of the carrier transport blocking layer on the base substrate; and the first sub-portion and the second sub-portion are in contact with the carrier transport blocking layer.

\* \* \* \* \*